(12) United States Patent
Satpathy et al.

(10) Patent No.: US 10,177,782 B2
(45) Date of Patent: Jan. 8, 2019

(54) HARDWARE APPARATUSES AND METHODS FOR DATA DECOMPRESSION

(71) Applicant: Intel Corporation, Santa Clara, CA (US)

(72) Inventors: Sudhir K. Satpathy, Hillsboro, OR (US); James D. Guilford, Northborough, MA (US); Sanu K. Mathew, Hillsboro, OR (US); Vinodh Gopal, Westborough, MA (US); Vikram B. Suresh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 369 days.

(21) Appl. No.: 14/757,854

(22) Filed: Dec. 26, 2015

(65) Prior Publication Data

US 2017/0187388 A1    Jun. 29, 2017

(51) Int. Cl.
*H03M 7/30* (2006.01)
*H03M 7/40* (2006.01)
(Continued)

(52) U.S. Cl.
CPC ........ *H03M 7/3082* (2013.01); *G06F 9/3877* (2013.01); *G06F 9/46* (2013.01);
(Continued)

(58) Field of Classification Search
CPC ............ H03M 7/3082; H03M 7/6017; H03M 7/6005; H03M 7/4037; G06F 9/46; G06F 9/3877
(Continued)

(56) References Cited

U.S. PATENT DOCUMENTS 6,650,259 B1 * 11/2003 Cooper ............... H03M 7/3088
341/106
7,079,693 B2 * 7/2006 Kerofsky ............... G06T 9/005
382/233
(Continued)

OTHER PUBLICATIONS

International Search Report and Written Opinion for Application No. PCT/US2016/63801, dated Mar. 13, 2017, 10 pages.
(Continued)

*Primary Examiner* — Brian Young
(74) *Attorney, Agent, or Firm* — Nicholson De Vos Webster & Elliott LLP

(57) ABSTRACT

Methods and apparatuses relating to data decompression are described. In one embodiment, a hardware processor includes a core to execute a thread and offload a decompression thread for an encoded, compressed data stream comprising a literal code, a length code, and a distance code, and a hardware decompression accelerator to execute the decompression thread to selectively provide the encoded, compressed data stream to a first circuit to serially decode the literal code to a literal symbol, serially decode the length code to a length symbol, and serially decode the distance code to a distance symbol, and selectively provide the encoded, compressed data stream to a second circuit to look up the literal symbol for the literal code from a table, look up the length symbol for the length code from the table, and look up the distance symbol for the distance code from the table.

24 Claims, 19 Drawing Sheets

(51) Int. Cl.
*G06F 9/38* (2018.01)
*G06F 9/46* (2006.01)

(52) U.S. Cl.
CPC ....... *H03M 7/4037* (2013.01); *H03M 7/6005* (2013.01); *H03M 7/6011* (2013.01); *H03M 7/6017* (2013.01); *H03M 7/6052* (2013.01)

(58) Field of Classification Search
USPC ............................................ 341/51, 87, 106
See application file for complete search history.

(56) References Cited

U.S. PATENT DOCUMENTS

| | | |
|---|---|---|
| 7,353,233 B1 | 4/2008 | Ganca |
| 7,439,887 B2 * | 10/2008 | Leung ................. H03M 7/3088 341/104 |
| 8,125,357 B1 * | 2/2012 | Hamlet ............... H03M 7/3086 341/50 |
| 8,947,270 B2 | 2/2015 | Gopal et al. |
| 9,306,596 B2 | 4/2016 | Satpathy et al. |
| 2009/0058693 A1 | 3/2009 | Laker et al. |
| 2010/0141488 A1 | 6/2010 | Baktir et al. |
| 2013/0249716 A1 | 9/2013 | Carlson |

OTHER PUBLICATIONS

Deutsch, L. P., "Deflate Compressed Data Format Specification version 1.3", Network Working Group RFC 1951, May 1996, pp. 1-15.

\* cited by examiner

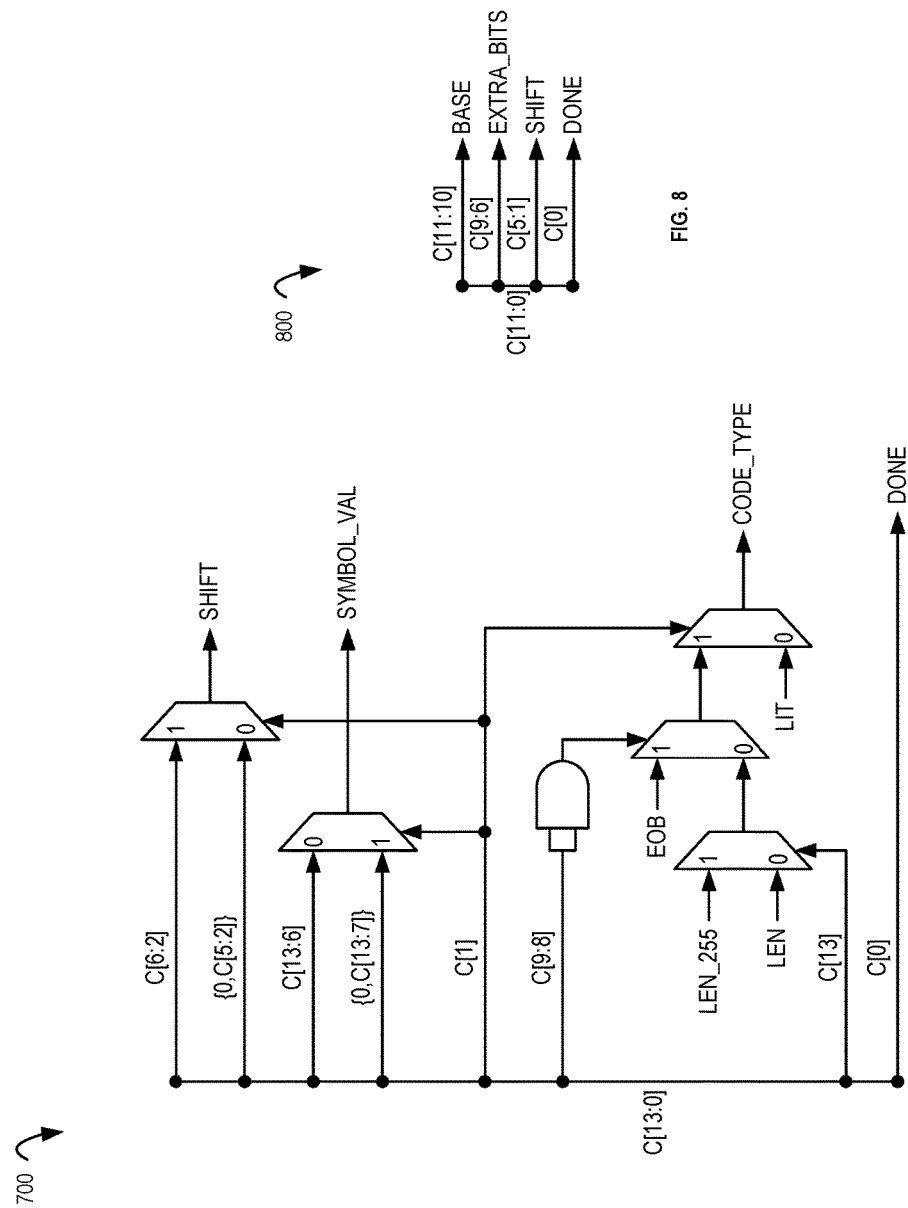

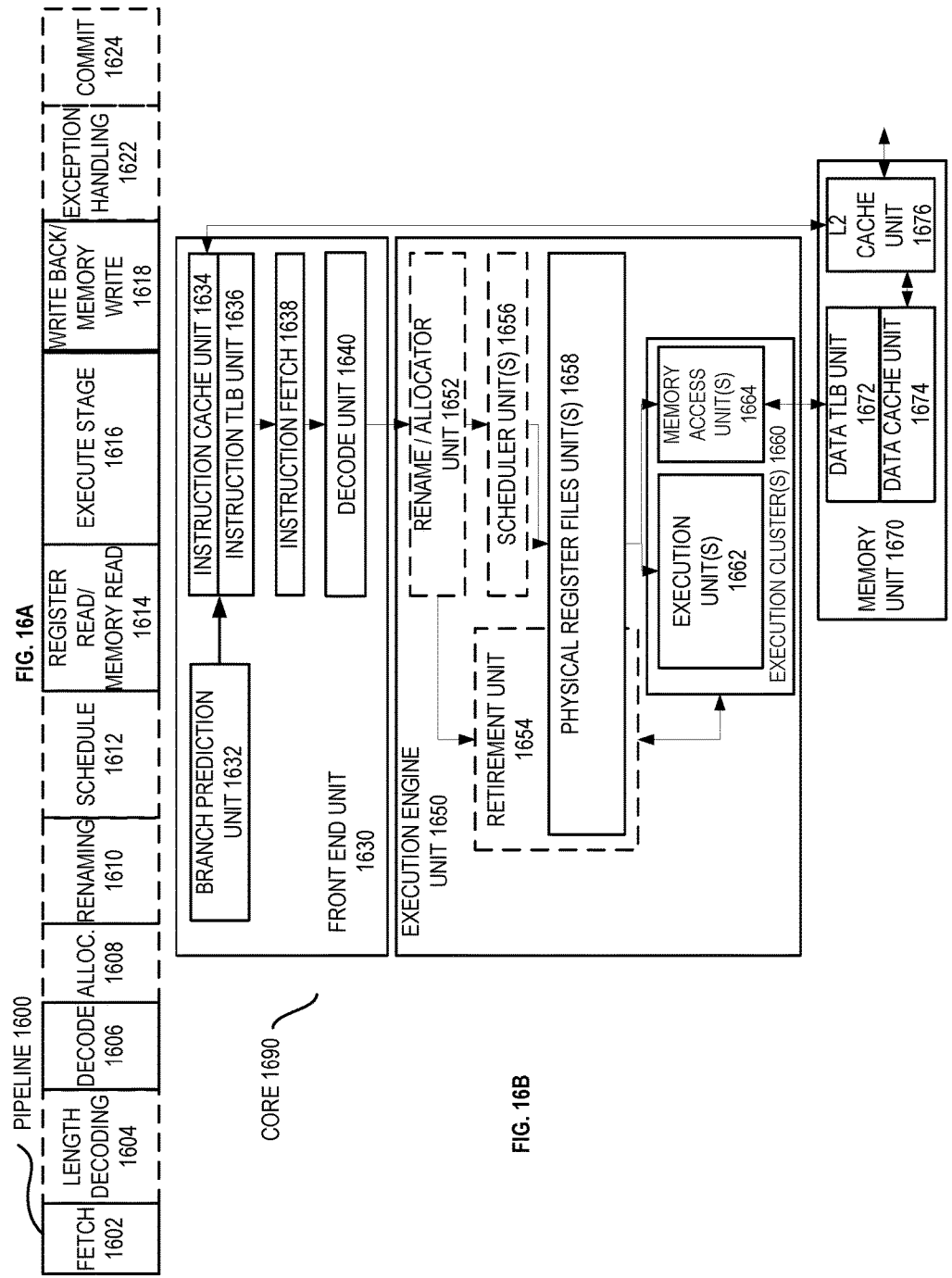

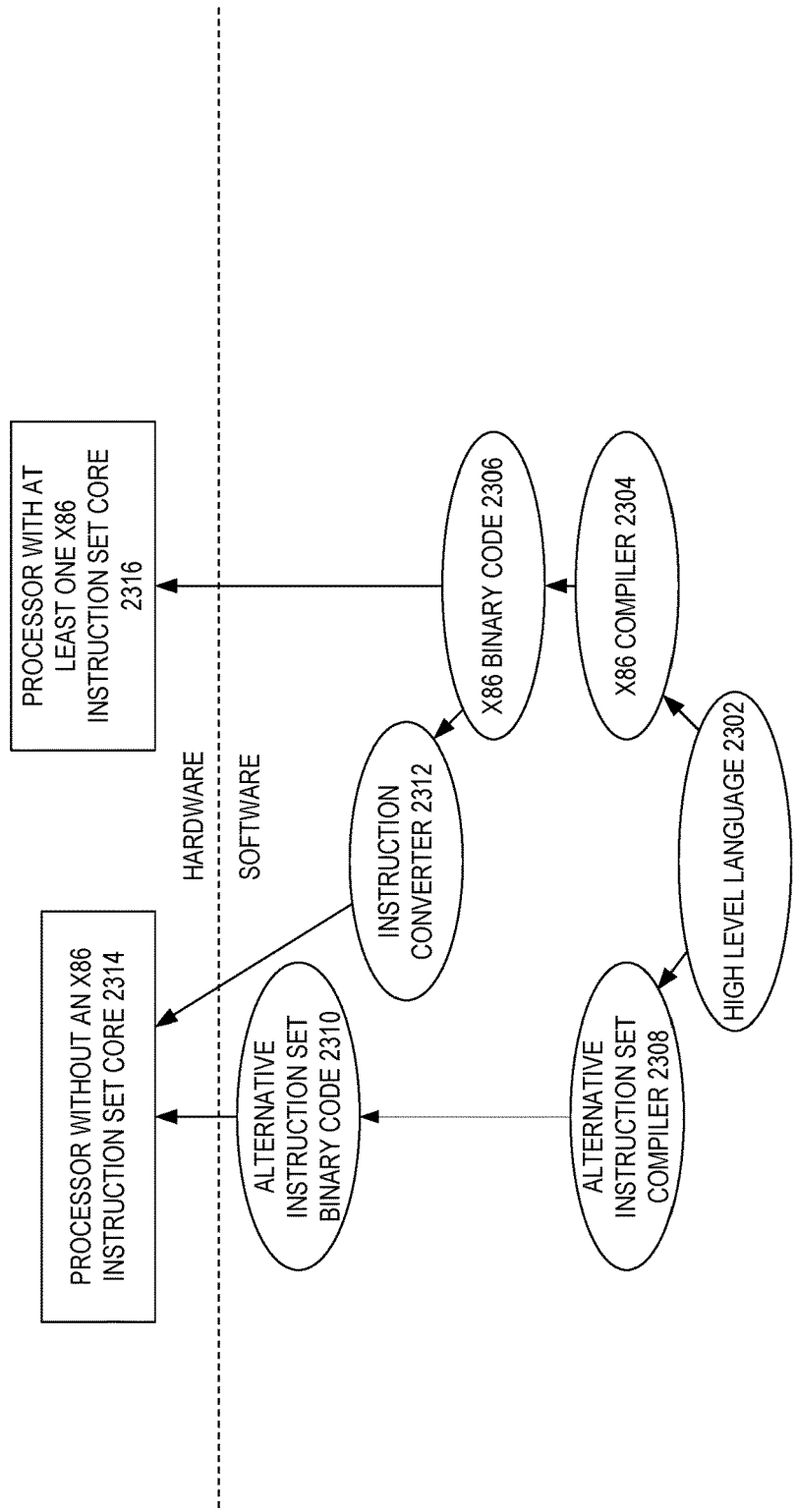

US 10,177,782 B2

HARDWARE APPARATUSES AND METHODS FOR DATA DECOMPRESSION

TECHNICAL FIELD

The disclosure relates generally to electronics, and, more specifically, an embodiment of the disclosure relates to a hardware accelerator to decompress data.

BACKGROUND

A processor, or set of processors, executes instructions from an instruction set, e.g., the instruction set architecture (ISA). The instruction set is the part of the computer architecture related to programming, and generally includes the native data types, instructions, register architecture, addressing modes, memory architecture, interrupt and exception handling, and external input and output (I/O). It should be noted that the term instruction herein may refer to a macro-instruction, e.g., an instruction that is provided to the processor for execution, or to a micro-instruction, e.g., an instruction that results from a processor's decoder decoding macro-instructions.

BRIEF DESCRIPTION OF THE DRAWINGS

The present disclosure is illustrated by way of example and not limitation in the figures of the accompanying drawings, in which like references indicate similar elements and in which:

FIG. 7 illustrates a circuit to determine from a table a literal symbol for a literal code and a length symbol for a length code according to embodiments of the disclosure.

FIG. 8 illustrates a circuit to determine from a table a distance symbol for a distance code according to embodiments of the disclosure.

FIG. 16A is a block diagram illustrating both an exemplary in-order pipeline and an exemplary register renaming, out-of-order issue/execution pipeline according to embodiments of the disclosure.

FIG. 16B is a block diagram illustrating both an exemplary embodiment of an in-order architecture core and an exemplary register renaming, out-of-order issue/execution architecture core to be included in a processor according to embodiments of the disclosure.

FIG. 23 is a block diagram contrasting the use of a software instruction converter to convert binary instructions in a source instruction set to binary instructions in a target instruction set according to embodiments of the disclosure.

DETAILED DESCRIPTION

Figure 1:
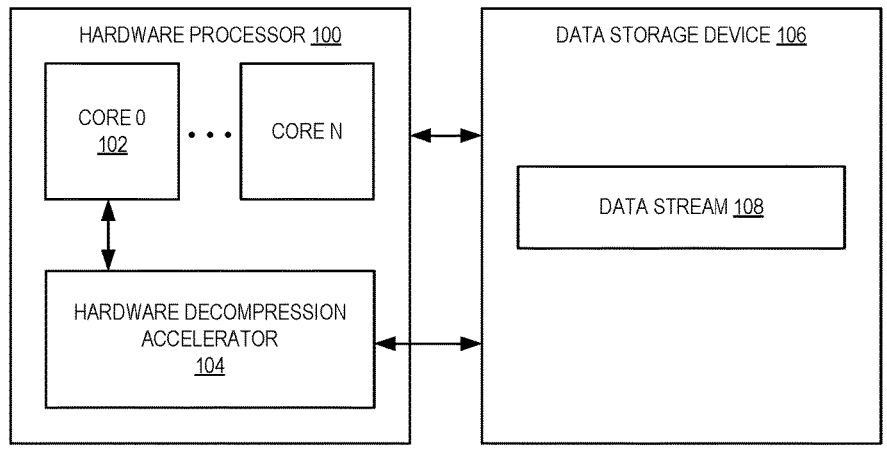
FIG. 1 illustrates a hardware processor with a hardware decompression accelerator according to embodiments of the disclosure.

In the following description, numerous specific details are set forth. However, it is understood that embodiments of the disclosure may be practiced without these specific details. In other instances, well-known circuits, structures and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

A (e.g., hardware) processor (e.g., having one or more cores) may execute instructions (e.g., a thread of instructions) to operate on data, for example, to perform arithmetic, logic, or other functions. For example, software may request an operation and a hardware processor (e.g., a core or cores thereof) may perform the operation in response to the request. In one embodiment, a processor is coupled to an (e.g., on die or off die) accelerator (e.g., an offload engine) to perform one or more (e.g., offloaded) operations, for example, instead of those operations being performed only on the processor. In one embodiment, a processor includes an (e.g., on die or off die) accelerator (e.g., an offload engine) to perform one or more operations, for example, instead of those operations being performed only on the processor.

Two non-limiting examples of operations are a compression operation and a decompression operation. A compression operation may refer to encoding information using fewer bits than the original representation. A decompression operation may refer to decoding the compressed information back into the original representation. A compression operation may compress data from a first format to a compressed, second format. A decompression operation may decompress data from a compressed, first format to an uncompressed, second format. A compression operation may be performed according to an (e.g., compression) algorithm. A decompression operation may be performed according to an (e.g., decompression) algorithm.

In one embodiment, an accelerator may perform a compression operation (e.g., thread) and/or decompression operation (e.g., thread), for example, in response to a request to and/or for a processor (e.g., a central processing unit (CPU)) to perform that operation. An accelerator may be a hardware compression accelerator or a hardware decompression accelerator. An accelerator may couple to one or more buffers (e.g., on die with an accelerator or off die) to store data, e.g., the input data and/or the output data. In one embodiment, an accelerator couples to an input buffer to load input therefrom. In one embodiment, an accelerator couples to an output buffer to store output thereon. A processor may execute an instruction to offload an operation or operations (e.g., an instruction, a thread of instructions, or other work) to an accelerator.

An operation may be performed on a data stream (e.g., stream of input data). A data stream may be an encoded, compressed data stream. In one embodiment, data is first compressed, e.g., according to a compression algorithm, such as, but not limited to, the LZ77 lossless data compression algorithm or the LZ78 lossless data compression algorithm. In one embodiment, a compressed symbol that is output from a compression algorithm may be encoded into a code, for example, encoded according to the Huffman algorithm (Huffman encoding), e.g., such that more common symbols are represented by code that uses fewer bits than less common symbols. In certain embodiments, a code that represents (e.g., maps to) a symbol includes fewer bit in the code than in the symbol. In certain embodiments of encoding, each fixed-length input symbol is represented by (e.g., maps to) a corresponding variable-length (e.g., prefix free) output code (e.g., code value).

The DEFLATE data compression algorithm may be utilized to compress and decompress a data stream (e.g., data set). In certain embodiments of a DEFLATE compression, a data stream (e.g., data set) is divided into a sequence of data blocks and each data block is compressed separately. An end-of-block (EOB) symbol may be used to denote the end of each block. In certain embodiments of a DEFLATE compression, the LZ77 algorithm contributes to DEFLATE compression by allowing repeated character patterns to be represented with (length, distance) symbol pairs where a length symbol represents the length of a repeating character pattern and a distance symbol represents its distance, e.g., in bytes, to an earlier occurrence of the pattern. In certain embodiments of a DEFLATE compression, if a character pattern is not represented as a repetition of its earlier occurrence, it is represented by a sequence of literal symbols, e.g., corresponding to 8-bit byte patterns.

In certain embodiments, Huffman encoding is used in DEFLATE compression for encoding the length, distance, and literal symbols, e.g., and end-of-block symbols. In one embodiment, the literal symbols (e.g., values from 0 to 255), for example, used for representing all 8-bit byte patterns, together with the end-of-block symbol (e.g., the value 256) and the length symbols (e.g., values 257 to 285), are encoded as literal/length codes using a first Huffman code tree. In one embodiment, the distance symbols (e.g., represented by the values from 0 to 29) are encoded as distance codes using a separate, second Huffman code tree. Code trees may be stored in a header of the data stream. In one embodiment, every length symbol has two associated values, a base length value and an additional value denoting the number of extra bits to be read from the input bit-stream. The extra bits may be read as an integer which may be added to the base length value to give the absolute length represented by the length symbol occurrence. In one embodiment, every distance symbol has two associated values, a base distance value and an additional value denoting the number of extra bits to be read from the input bit-stream. The base distance value may be added to the integer made up of the associated number of extra bits from the input bit-stream to give the absolute distance represented by the distance symbol occurrence. In one embodiment, a compressed block of DEFLATE data is a hybrid of encoded literals and LZ77 look-back indicators terminated by an end-of-block indicator. In one embodiment, DEFLATE may be used to compress a data stream and INFLATE may be used to decompress the data stream. INFLATE may generally refer to the decoding process that takes a DEFLATE data stream for decompression (and decoding) and correctly produces the original full-sized data or file. In one embodiment, a data stream is an encoded, compressed DEFLATE data stream, for example, including a plurality of literal codes (e.g., codewords), length codes (e.g., codewords), and distance codes (e.g., codewords).

Certain embodiments herein provide for a platform scalable and fully synthesizable (e.g., DEFLATE) hardware decompression accelerator that uses a hybrid serially decoding (e.g., arithmetic logic unit (ALU)) assisted look-up table (LUT) to speed up the (e.g., performance critical) decode (e.g., Huffman decode) operation during decompression. In certain embodiments, DEFLATE compression compresses raw data into a stream of literals and length and distance pair symbols that are subsequently Huffman encoded for optimal compression. In one embodiment, each symbol is represented by a code varying in length from 1 b-15 b. Certain embodiments herein include a dual circuit (e.g., path) design that selectively decodes (e.g., smaller and larger) codes to symbols via a look-up table (LUT) based second circuit (e.g., fast-path) and a compute intensive serially operating first circuit (e.g., slow-path). In one embodiment, extra shift magnitude computation circuitry is not included in the second circuit (e.g., fast-path) and (e.g., additional) bit shift magnitude compute cycles are not utilized in the first circuit (e.g., slow-path) during Huffman decoding. Certain embodiments herein include a (e.g., intermediate) data format for populating a table (e.g., LUT), for example, to eliminate the need for additional shift compute logic from a (e.g., critical) second circuit (e.g., fast-path). Certain embodiments herein include a first (e.g., ALU) circuit (e.g., slow path) that is to process Huffman codes in any arbitrary order of code lengths (e.g., as opposed to only in order of increasing lengths), which may reduce the first circuit (e.g., slow(er)-path) latency and increase overall throughput. Although DEFLATE is discussed as an example, certain embodiments herein may be utilized with other forms of encoded data (e.g., other forms of Huffman encoded codes, such as, but not limited to, such as in JPEG, MPEG, or other lossless compression algorithms).

In certain embodiments, each symbol in a (e.g., DEFLATE) compressed stream is represented by an encoded (e.g., Huffman) code varying in length from 1 bit (b) to 15 bits (b). Some of the (e.g., length and distance) codes may use a variable number of additional bits (e.g., 0-13 b) from the payload that are then concatenated with the Huffman decoded base during decompression to generate the actual magnitudes of lengths and distances. Thus in certain embodiments, each compressed symbol may vary in length from 1 b-28 b. In one embodiment, the length of the Huffman code is added to the number of extra bits consumed after the Huffman decode step to generate the bit shift magnitude (e.g., shift amount) for advancing the payload to obtain the next code. Certain embodiments herein include a (e.g., intermediate) data format which stores pre-computed shift amounts (e.g., in the second circuit (e.g., fast-path) LUT), for example, to eliminate any further computation for fetching the next code of the payload.

Certain embodiments herein output an intermediate value for a symbol (e.g., an intermediate value from a LUT for a code). An intermediate value for a symbol (e.g., intermediate symbol) may be converted into the original (e.g., DEFLATE) symbol, for example, by a circuit, such as, but not limited to, those circuits in FIGS. 7 and 8, e.g., and not by an ALU.

Certain embodiments herein of a first (e.g., ALU) circuit (e.g., slow-path) decoding of a code to a symbol may include pre-computing the total number of Huffman codes that are less than a given (e.g., pre-selected) bit length (e.g., code length) in addition to the total number of codes corresponding to that given bit length (e.g., code length). In one embodiment, the given bit length is less than a maximum bit length (e.g., code length). Certain embodiments herein allow evaluating a code against any arbitrary code length, e.g., as opposed to a code being evaluated against smaller codes first before trying out longer codes (e.g., longer than the given code length). In certain embodiments, by breaking the serial dependency, the first (e.g., ALU) circuit (e.g., slow path) may opportunistically evaluate codes with a higher probability of occurrence early, for example, thereby improving performance as well as energy efficiency by opportunistically avoiding wasteful decode attempts that are to fail (e.g., a majority of the time).

Certain embodiments herein include a literal stream accumulation and record (e.g., a length and distance pair) generation interface (e.g., at the back-end) which may reduce memory usage by storing symbols (e.g., tokens) in a hardware friendly intermediate format, e.g., that may be seamlessly converted into memory load and store instructions for creating uncompressed output.

Certain embodiments herein improve a second circuit (e.g., fast-path) critical path latency by eliminating additional shift computation hardware for fetching the next code of the payload. In one embodiment, the majority (e.g., 95%) of the codes are decoded in the second circuit (e.g., fast-path), for example, where the circuit includes 512 entry LUT(s) to handle codes up to 9 b in total length.

Certain embodiments herein provide flexibility to evaluate any arbitrary code length in the first (e.g., ALU) circuit (e.g., slow-path) and not only may enable dynamic run-time adaptation for early decode completion (e.g., by evaluating more probable codes early) improving the first (e.g., ALU) circuit (e.g., slow-path) decompression throughput, but also may provide an opportunity for custom look-up table elimination, e.g., enabling a light-weight fully synthesizable (e.g., DEFLATE) hardware decompression accelerator implementation for area constrained systems (e.g., SoCs). Certain embodiments herein also enable multiple first (e.g., ALU) circuits (e.g., slow-path) to operate in parallel on a payload, for example, as illustrated in FIG. 4B, e.g., providing opportunity for higher throughput. Certain embodiments break a serial dependency by allowing multiple first types of (e.g., ALU) circuits (e.g., slow-path) to evaluate any code length. One embodiment includes multiple first types of (e.g., ALU) circuits (e.g., slow-path), e.g., where each circuit evaluates a different code length. For example, with 15 first types of (e.g., ALU) circuits and one for each code length of 1 b-15 bit codes, a system (e.g., accelerator) may evaluate all code lengths from 1 b-15 bit (e.g., simultaneously), for example, to complete a decode in 1 to 3 cycles. Such embodiments may or may not include a (e.g., LUT) look-up circuit (e.g., fast-path).

Certain embodiments of a DEFLATE decompression generate literal symbols and length and distance symbols which (e.g., if not consumed immediately) may include usage of additional storage for back-end processing, for example, each compressed code in the data stream (e.g., payload) generating a literal, length, or distance symbol. Certain embodiments herein provide for literal stream accumulation, e.g., to provide a compact storage format to optimally store literals in groups of 8 (e.g., 64 bits total). Certain embodiments herein include record generation circuitry to correctly pair length and distance symbols and/or optimally pack multiple consecutive literal symbols into a single instruction (e.g., as an operand of the single instruction), for example, for the processor to then convert those symbols into the uncompressed data. In one embodiment, packing multiple consecutive literal symbols into a single instruction results in fewer instructions as compared to an approach where each literal symbol is represented by a unique intermediate instruction.

FIG. 1 illustrates a hardware processor 100 with a hardware decompression accelerator 104 according to embodiments of the disclosure. Hardware processor 100 (e.g., core 102) may receive a request (e.g., from software) to perform a decompression (e.g., DEFLATE) thread (e.g., operation) and may offload (e.g., at least part of) the decompression thread (e.g., operation) to a hardware accelerator (e.g., hardware decompression accelerator 104). Hardware processor 100 may include one or more cores (0 to N). In one embodiment, each core may communicate with (e.g., be coupled to) hardware decompression accelerator 104. In one embodiment, each core may communicate with (e.g., be coupled to) one of multiple hardware decompression accelerators. Core(s), accelerator(s), and data storage device 106 may communicate (e.g., be coupled) with each other. Arrows indicate two way communication (e.g., to and from a component), but one way communication may be used. In one embodiment, a (e.g., each) core may communicate (e.g., be coupled) with the data storage device, for example, storing and/or outputting a data stream 108. Hardware accelerator may include any hardware (e.g., circuit or circuitry) discussed herein. In one embodiment, an (e.g., each) accelerator may communicate (e.g., be coupled) with the data storage device, for example, to receive an encoded, compressed data stream.

Figure 2:
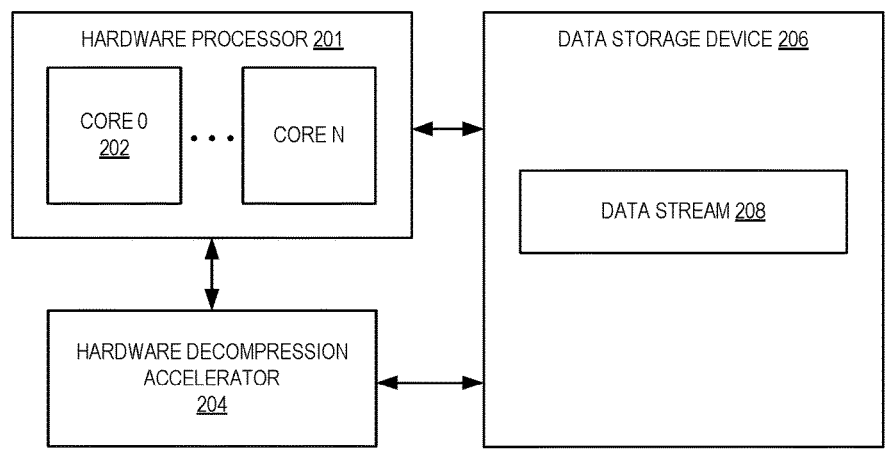
FIG. 2 illustrates a hardware processor and a hardware decompression accelerator according to embodiments of the disclosure.

FIG. 2 illustrates a hardware processor 201 and a hardware decompression accelerator 204 according to embodiments of the disclosure. In one embodiment, a hardware decompression accelerator is on die with a hardware processor. In one embodiment, a hardware decompression accelerator is off die of a hardware processor. In one embodiment, system 200 including at least a hardware processor 201 and a hardware decompression accelerator 204 are a SoC. Hardware processor 201 (e.g., core 202) may receive a request (e.g., from software) to perform a decompression (e.g., DEFLATE) thread (e.g., operation) and may offload (e.g., at least part of) the decompression thread (e.g., operation) to a hardware accelerator (e.g., hardware decompression accelerator 204). Hardware processor 201 may include one or more cores (0 to N). In one embodiment, each core may communicate with (e.g., be coupled to) hardware decompression accelerator 204. In one embodiment, each core may communicate with (e.g., be coupled to) one of multiple hardware decompression accelerators. Core(s), accelerator(s), and data storage device 206 may communicate (e.g., be coupled) with each other. Arrows indicate two way communication (e.g., to and from a component), but one way communication may be used. In one embodiment, a (e.g., each) core may communicate (e.g., be coupled) with the data storage device, for example, storing and/or outputting a data stream 208. Hardware accelerator may include any hardware (e.g., circuit or circuitry) discussed herein. In one embodiment, an (e.g., each) accelerator may communicate (e.g., be coupled) with the data storage device, for example, to receive an encoded, compressed data stream. Data stream 208 (e.g., encoded, compressed data stream) may be previously loaded into data storage device 206, e.g., by a hardware compression accelerator or a hardware processor.

Figure 3:
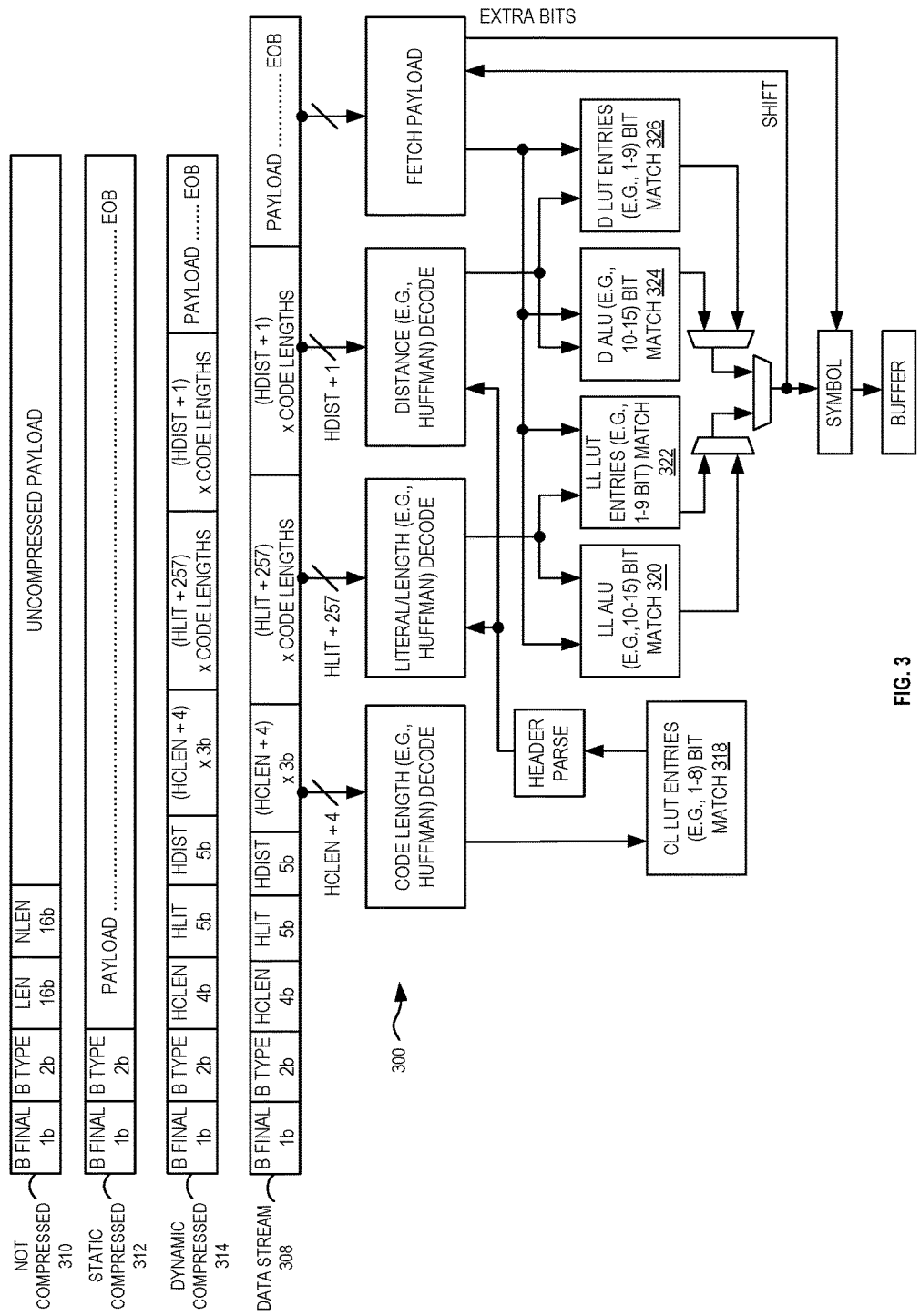
FIG. 3 illustrates a decompression accelerator pipeline according to embodiments of the disclosure.

FIG. 3 illustrates a decompression accelerator pipeline 300 according to embodiments of the disclosure. Note that the numbers (e.g., number of bits) utilized are examples and other numbers may be utilized. Hardware decompression accelerator 104 in FIG. 1 and/or hardware decompression accelerator 204 in FIG. 2 may include decompression accelerator pipeline 300, e.g., one or more circuits therefrom.

Depicted "not compressed" data stream 310 includes a block final field (B FINAL) (e.g., as a single bit) to indicate if the block is the last block in the stream (e.g., 1 to indicate that block of data is the last block in the data stream and 0 to indicate there are more blocks to process in the data stream), a block encoding field (e.g., as two bits) to indicate the encoding method used for this block type (e.g., where 00 indicates a stored/raw/literal section (for example, between 0 and 65,535 bytes in length), where 01 indicates a static Huffman compressed block (e.g., using a pre-agreed Huffman tree), 10 indicates a compressed block complete with the Huffman table supplied, and 11 may be reserved for future use), a length field (LEN) (e.g., as 16 b) to indicate a length of the uncompressed payload, a not length field (NLEN) (e.g., as 16 b) to indicate a is complement of the value in the length field (LEN), and an uncompressed payload field to store the uncompressed data.

Depicted static compressed data stream 312 includes a block final field (B FINAL) (e.g., as a single bit) to indicate if the block is the last block in the stream (e.g., 1 to indicate that block of data is the last block in the data stream and 0 to indicate there are more blocks to process in the data stream), a block encoding field (e.g., as two bits) to indicate the encoding method used for this block type (e.g., where 00 indicates a stored/raw/literal section (for example, between 0 and 65,535 bytes in length), where 01 indicates a static Huffman compressed block (e.g., using a pre-agreed Huffman tree), 10 indicates a compressed block complete with the Huffman table supplied, and 11 may be reserved for future use), and a payload field that includes the symbols for the payload and ends with an end of block (EOB) indication, such as an EOB symbol (e.g., where an EOB value of 256 indicates an EOB).

In one embodiment, the alphabet for code lengths is (0-15) represents code lengths of 0-15, respectively, 16 indicates to copy the previous code length 3-6 times where 17 indicates to repeat a code length of 0 for 3-10 times (3 bits of length) and 18 indicates to repeat a code length of 0 for 11-138 times (7 bits of length).

Depicted dynamic compressed data stream 314 includes a block final field (B FINAL) (e.g., as a single bit) to indicate if the block is the last block in the stream (e.g., 1 to indicate that block of data is the last block in the data stream and 0 to indicate there are more blocks to process in the data stream), a block encoding field (e.g., as two bits) to indicate the encoding method used for this block type (e.g., where 00 indicates a stored/raw/literal section (for example, between 0 and 65,535 bytes in length), where 01 indicates a static Huffman compressed block (e.g., using a pre-agreed Huffman tree), 10 indicates a compressed block complete with the Huffman table supplied, and 11 may be reserved for future use), a HCLEN field (e.g., as four bits) to indicate the number of code length codes minus four, an HLIT field (e.g., as five bits) to indicate the number of literal and length codes minus 257, an HDIST field (e.g., as five bits) to indicate the number of distance codes minus one, the (HCLEN+4)×3 bits field to indicate the code lengths for the code length alphabet discussed above, the (HUT+257)×code lengths for the literal/length values encoded using the code length Huffman code, the (HDIST+1) code lengths for the distance values encoded using the code length Huffman code, and a payload field that includes the Huffman codes for the payload and ends with an end of block (EOB) indication, such as an EOB code.

FIG. 3 illustrates the format for three possible types of blocks (310, 312, 314) that may make up a DEFLATE compressed stream. In one embodiment, not compressed block 310 is skipped to process the next block because its header contains information about its exact length. In one embodiment, compressed block (312 and 314) is fully decoded to locate its EOB symbol, e.g., before the next block can be processed. In certain embodiments, each symbol within a compressed block may vary in length from 1 b-15 b, and some symbols may utilize an additional number of bits from the payload during decode. In one embodiment, when a symbol is not decoded in the table (e.g., LUT) circuit (e.g., fast-path), for example, Literal and Length (LL) LUT circuit 322 or Distance (D) LUT circuit 326, the serial decoding (e.g., ALU) circuit (e.g., slow-path), for example, LL ALU circuit 320 or D ALU circuit 324, is to complete the decode process by serially evaluating the payload against all possible code lengths. Following a successful decode operation, the literal, length, or distance symbol generated is used to reconstruct the raw stream, for example, in a (e.g., 32 KB) buffer. In one embodiment, a multiplexer (mux), for example, any or all of the three muxes in FIG. 3, is to select the first arriving input as its output.

FIG. 3 further illustrates the (e.g., encoded, compressed) data stream 308 with certain fields thereof being input into decompression accelerator pipeline 300. Decompression accelerator pipeline 300 includes a dual circuits (e.g., dual path, with one being a slower path and another being a faster (than the slower)) with each circuit to decode a (e.g., DEFLATE) code into a symbol, e.g., for further decompression into the original, uncompressed value. Depicted data stream 308 is in the dynamic compressed format. In one embodiment, DEFLATE compression uses LZ77 algorithm along with the canonical Huffman prefix coding scheme to generate literals and length+distance pairs using references from a (e.g., 32 KB) history buffer. In certain embodiments, the literal/length and distance symbols are again Huffman encoded to achieve further compression. In one embodiment, information to decode the symbol code lengths are gathered from the payload header and stored in the (e.g., 19 entry) code length look-up table (CL LUT) 318. In one embodiment, the Huffman code lengths from CL LUT are used to process the subsequent sections of the header to generate Huffman codes for the (e.g., 286) literal-length symbols and (e.g., 30) distance symbols. The literal-length and distance Huffman codes may be stored in LUTs (e.g., LL LUT 322 and D LUT 326, respectively) to avoid repetitive Huffman decode during the decompression process. In certain embodiments, all Huffman codes (e.g., a mapping of a Huffman code to the decoded symbol) are not stored in a LUT, e.g., because of the exponential dependency on code length (e.g., the length of each code), for example, handling all literal/length and distance codes (1 b-15 b) in a LUT may require at least 128 KB of storage. Furthermore, in certain embodiments, increasing LUT size may also increases access latency, e.g., thereby slowing down the look-up table circuit (e.g., fast-path). For example, a five bit length of code 10001 may be assigned to the symbol value "literal 0" (e.g., 0000 0000 in binary), and a second (e.g., fast-path) circuit (e.g., with a look-up table) may have 512 entries (e.g., for handling up to 9 bit length codes) such that all 16 entries corresponding to address 10000xxxx are to be filled with 0000 0000 (e.g., with a valid flag enabled for all those rows). In one embodiment, a set valid flag read from the second (e.g., fast-path) circuit (e.g., look-up table) indicates a successful decode. In certain embodiments of a table, all valid flags are initially set to zero and a valid flag is set to one when the entry (for example, a row, e.g., in the table in FIG. 9 or 10) is populated.

Figure 9:
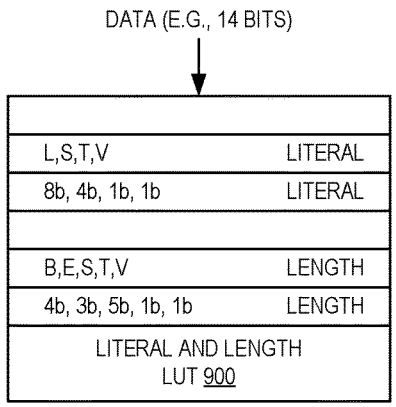
FIG. 9 illustrates entry formats for a table of mappings of a literal symbol for a literal code and a length symbol for a length code according to embodiments of the disclosure.
Figure 10:
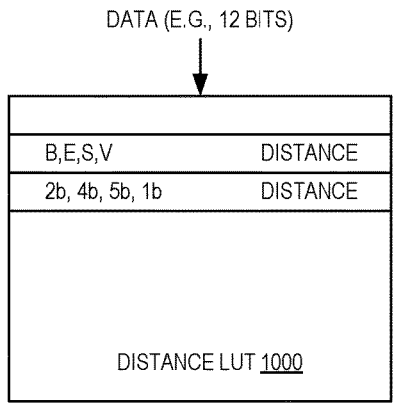
FIG. 10 illustrates an entry format for a table of mappings of a distance symbol for a distance code according to embodiments of the disclosure.
Figure 11:
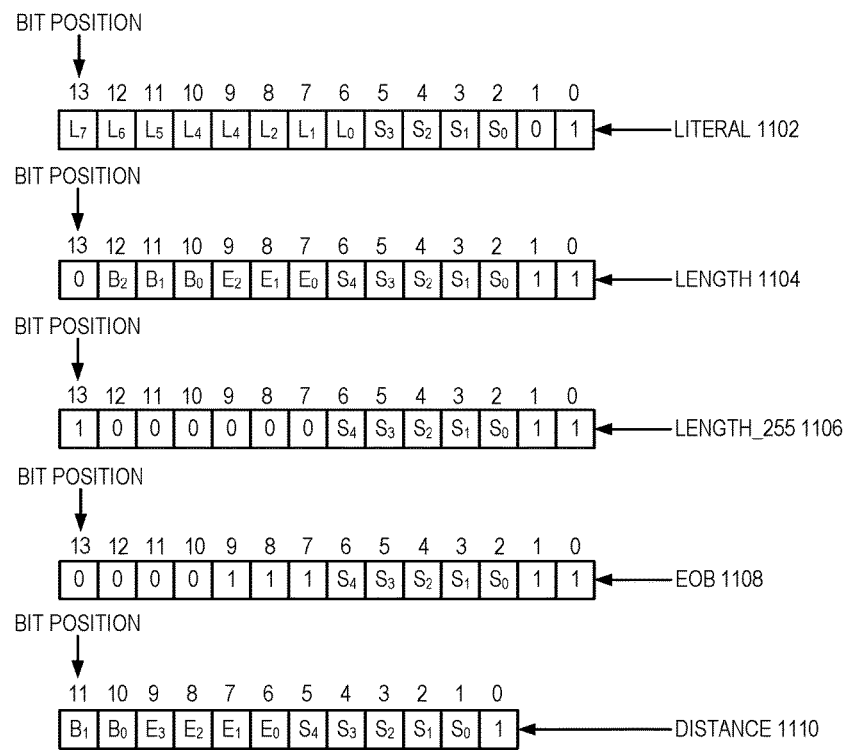
FIG. 11 illustrates entry formats for a table of an end of block (EOB) indication and for mappings of a literal symbol for a literal code, a length symbol for a length code, a length symbol for a 255 bit length code, and a distance symbol for a distance code according to embodiments of the disclosure.

In one embodiment, a serial decoding circuit (e.g., ALU) (e.g., slow-path) may be selectively used for codes longer than a maximum bit length (e.g., for codes that are rarely encountered), for example, in conjunction with the look-up table circuit (e.g., LUT) (e.g., fast-path), for example, for more frequent shorter codes. In one embodiment, a circuit is to populate a (e.g., each) table with the values that map a code to a symbol, for example, as shown in FIGS. 9-11. In one embodiment, the circuit is to populate the table(s) with an intermediate value (e.g., intermediate symbol) representing the symbol and that intermediate value (e.g., intermediate symbol) may be converted to a symbol by a circuit, for example, the circuits in FIGS. 7 and 8.

Decoding symbols from codes in the input stream to generate literal and length+distance symbols may be a performance critical loop in DEFLATE decompression. In certain embodiments, the sum of code length and the extra number of bits that are picked from the payload is the actual number of bits that are consumed in any particular decode cycle. The payload in one embodiment is then shifted by the number of bits consumed to generate the next code (e.g., set of 15 bits) for evaluation, and the (e.g., fast-path) look-up process may be repeated until the end-of-block (EOB) symbol is decoded. A new header (e.g., B FINAL and B TYPE) may be processed after EOB and (e.g., all) LUTs may be repopulated before decoding the next block of compressed data.

Symbol output from decompression accelerator pipeline 300 may be the (e.g., final) symbol or an intermediate value (e.g., intermediate symbol), for example, according to a format in FIGS. 9-11. In one embodiment, an intermediate value (e.g., intermediate symbol) is converted to a symbol by a circuit, for example, the circuit in FIG. 7 or FIG. 8.

Figure 4A:
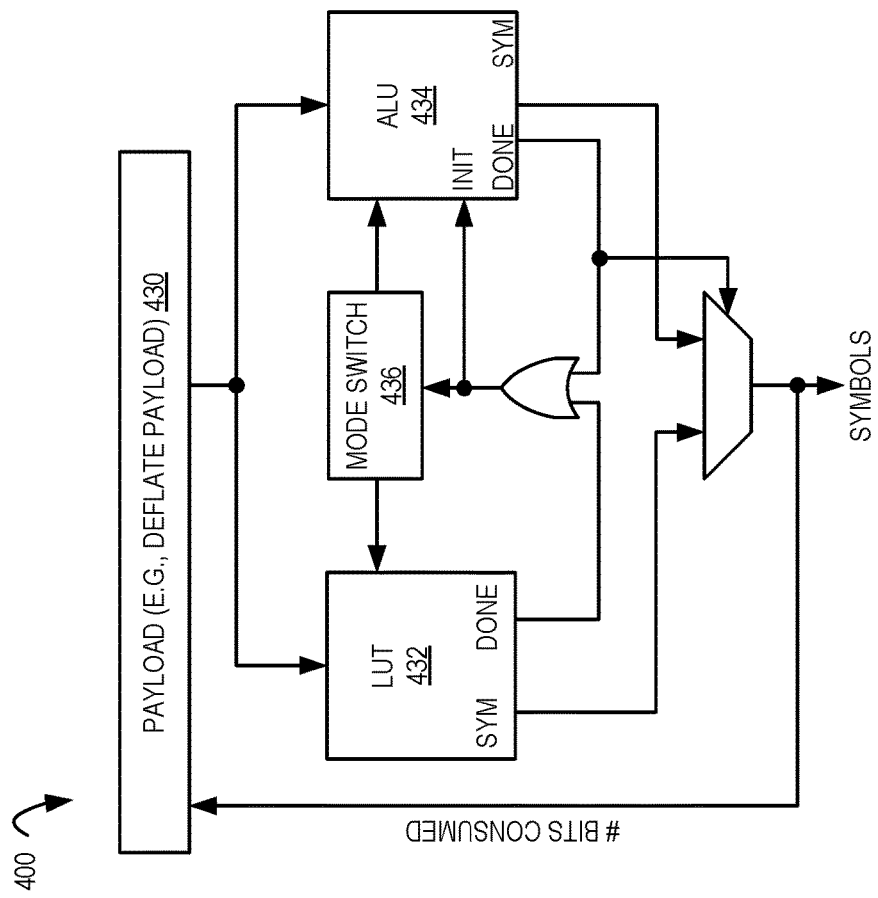
FIG. 4A illustrates a dual path decoder circuit according to embodiments of the disclosure.
Figure 4B:
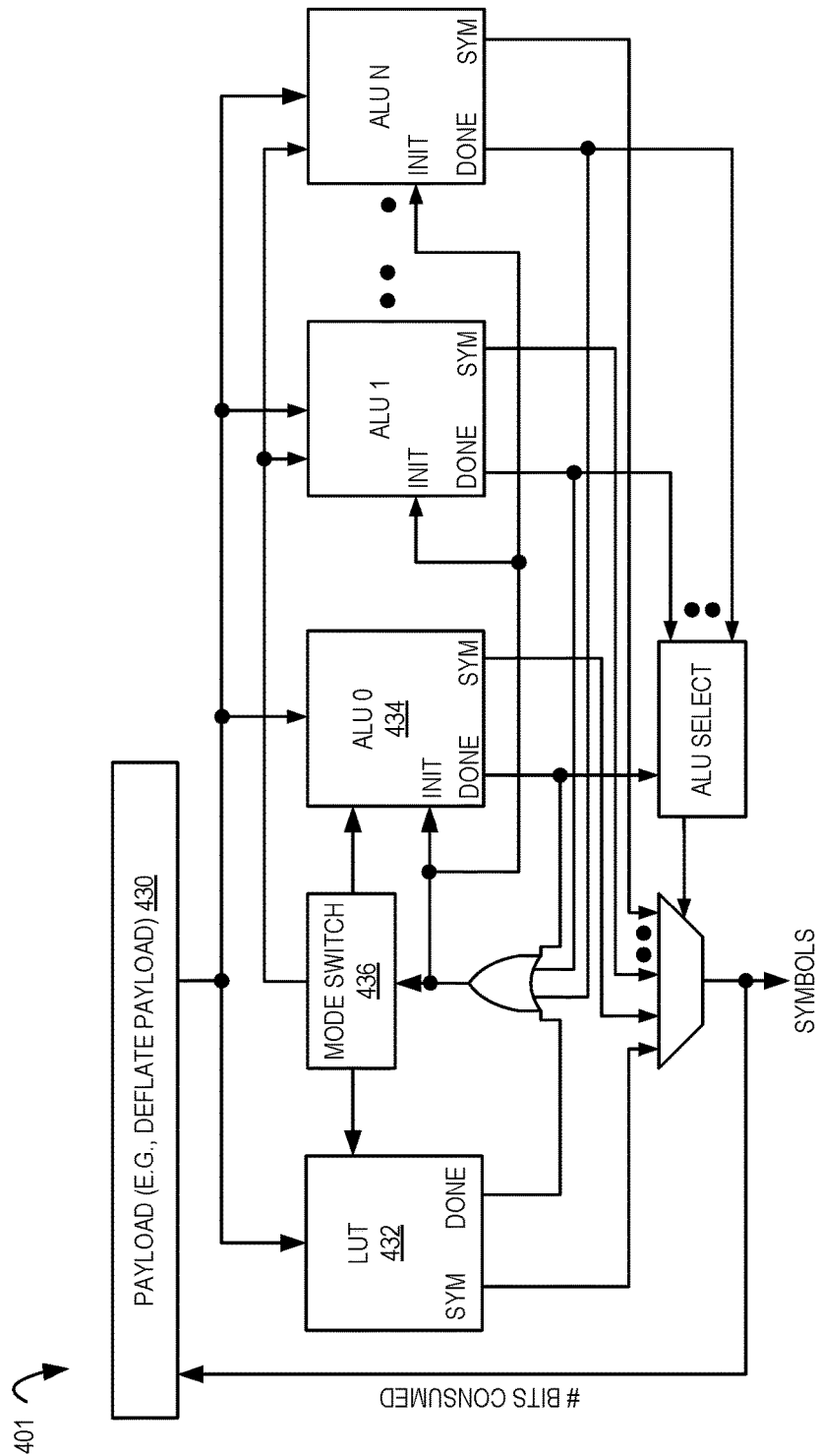
FIG. 4B illustrates a multiple path decoder circuit according to embodiments of the disclosure.

FIG. 4A illustrates a dual path decoder circuit 400 according to embodiments of the disclosure. A hardware accelerator may include circuit 400. Circuit 400 includes a first (e.g., slow-path) circuit (e.g., with an ALU 434) to input a (e.g., Huffman encoded) code and serially decode the symbol from the code (e.g., serially comparing the code to all of the possible codes to determine the symbol). Circuit 400 includes a second (e.g., fast-path) circuit (e.g., with a look-up table 432) to input a (e.g., Huffman encoded) code and output a symbol (e.g., if the table includes an entry mapping the code to its decoded symbol). In one embodiment, circuit 400 processes symbols equal to or less than a selected, maximum bit size (e.g., less than the total bit size possible for a symbol) in the second (e.g., fast-path) circuit (e.g., with a look-up table 432), for example, and processes symbols greater than the selected, maximum bit size in the first (e.g., slow-path) circuit (e.g., with an ALU 434). In one embodiment, all symbols who have a total length of 1 b to 9 b are processed in the second (e.g., fast-path) circuit (e.g., with a look-up table 432), e.g., and the remaining symbols are processed in the first (e.g., slow-path) circuit (e.g., with an ALU 434). In one embodiment, the LUT is implemented in static random access memory (SRAM). In certain embodiments, each type of code (e.g., of a literal code, length code, and distance code) includes its own dual path circuit (e.g., circuit 400). In certain embodiments, a literal code and length code share a same dual path circuit (e.g., circuit 400) and a distance code includes its own dual path circuit (e.g., circuit 400), for example, as depicted in FIG. 3 with an ALU circuit 320. In one embodiment, mode switch 436 of circuit 400 is to switch between a mode for each type of code (e.g., a literal code, length code, and distance code), for example, on detection of that type of code. In one embodiment, mode switch 436 of circuit 400 is to switch between a first mode for a literal or length type of code and a second mode for a distance type of code), for example, on detection of that type of code. In one embodiment, an OR gate (e.g., in FIGS. 4A and 4B) indicates the cycle when an input is successfully decoded. For example, for a code having a bit length that is less than a given bit length (e.g., less than 10 b), the second (e.g., fast-path) circuit (e.g., with a look-up table 432) may get a hit (e.g., by reading a valid flag) in the same cycle, and the MUX may select the result from the second (e.g., fast-path) circuit (e.g., with a look-up table 432). In one embodiment, if the second (e.g., fast-path) circuit (e.g., with a look-up table 432) misses (e.g., the symbol for the code is not in the table), then (e.g., a few cycles later) the first (e.g., slow-path) circuit (e.g., with an ALU 434) may detect that and then indicate decode completion, and in such a scenario, the MUX selects the results from the second (e.g., fast-path) circuit (e.g., with a look-up table 432).

In one embodiment, the payload 430 (e.g., DEFLATE payload) is processed simultaneously in the first (e.g., slow-path) circuit (e.g., with an ALU 434) and the second (e.g., fast-path) circuit (e.g., with a look-up table 432) and the correct decoded symbol (e.g., and bit shift magnitude) is selected from the circuit (e.g., path) that completes first. In one embodiment, e.g., with the flexible code length evaluation scheme discussed herein, the first (e.g., slow-path) circuit (e.g., with an ALU 434) may complete before the second (e.g., fast-path) circuit (e.g., with a look-up table 432). In certain embodiments, following a successful decode operation of code to symbol, a code length stepping circuit (e.g., state machine) may be initialized and the DEFLATE payload is advanced to process the next symbol. In one embodiment, both circuits (e.g., fast and slow paths) operate on a code concurrently (e.g., simultaneously) for example, for increased throughput. In one embodiment, the first (e.g., slow-path) circuit (e.g., with an ALU 434) is operated only after the second (e.g., fast-path) circuit (e.g., with a look-up table 432) reports a miss (e.g., the code is not in the table), for example, to avoid a wasteful slow path decode and improve energy efficiency. In one embodiment, a LUT takes an input of a code and then outputs the decoded symbol for that code (e.g., according to a Huffman encoding), for example, if there is an entry for the mapping of the code to symbol.

FIG. 4B illustrates a multiple path decoder circuit 401 according to embodiments of the disclosure. In comparison to FIG. 4A, the circuit 401 in FIG. 4B includes multiple (e.g., 2 or more) of the first (e.g., slow-path) types of circuit (e.g., each with an ALU). In one embodiment, each ALU is to serially decode codes with a bit length of a set of bit lengths (for example, bit lengths of a range (e.g., 10-12 bit lengths or 13-15 bit lengths) or certain (e.g., non-contiguous) bit lengths. In one embodiment, a first of the first type of circuit (e.g., ALU 0) is to serially decode codes with a bit length of a first set of bit lengths (e.g., in the 10-12 bit length range) and a second of the first type of circuit (e.g., ALU 1 or N) is to serially decode codes with a bit length of a second, different set of bit lengths (e.g., in the 13-15 bit length range).

In one embodiment, an accelerator may include one or more first (e.g., slow-path) types of circuit (e.g., each with an ALU) and/or one or more the second (e.g., fast-path) types of circuits (e.g., each with a look-up table). A code may be provided to a decoder circuit (e.g., circuit 400 or circuit 401) and the first of the circuits (e.g., paths) to decode the code into a symbol (or an intermediate value of a symbol) may output that symbol (or intermediate value of the symbol). In one embodiment, a decode circuit may have an ALU for each different mode.

Symbol output from circuit 400 and circuit 401 may be the (e.g., final) symbol or an intermediate value (e.g., intermediate symbol), for example, according to a format in FIGS. 9-11. In one embodiment, an intermediate value (e.g., intermediate symbol) is converted to a symbol by a circuit, for example, the circuit in FIG. 7 or FIG. 8.

Figure 5:
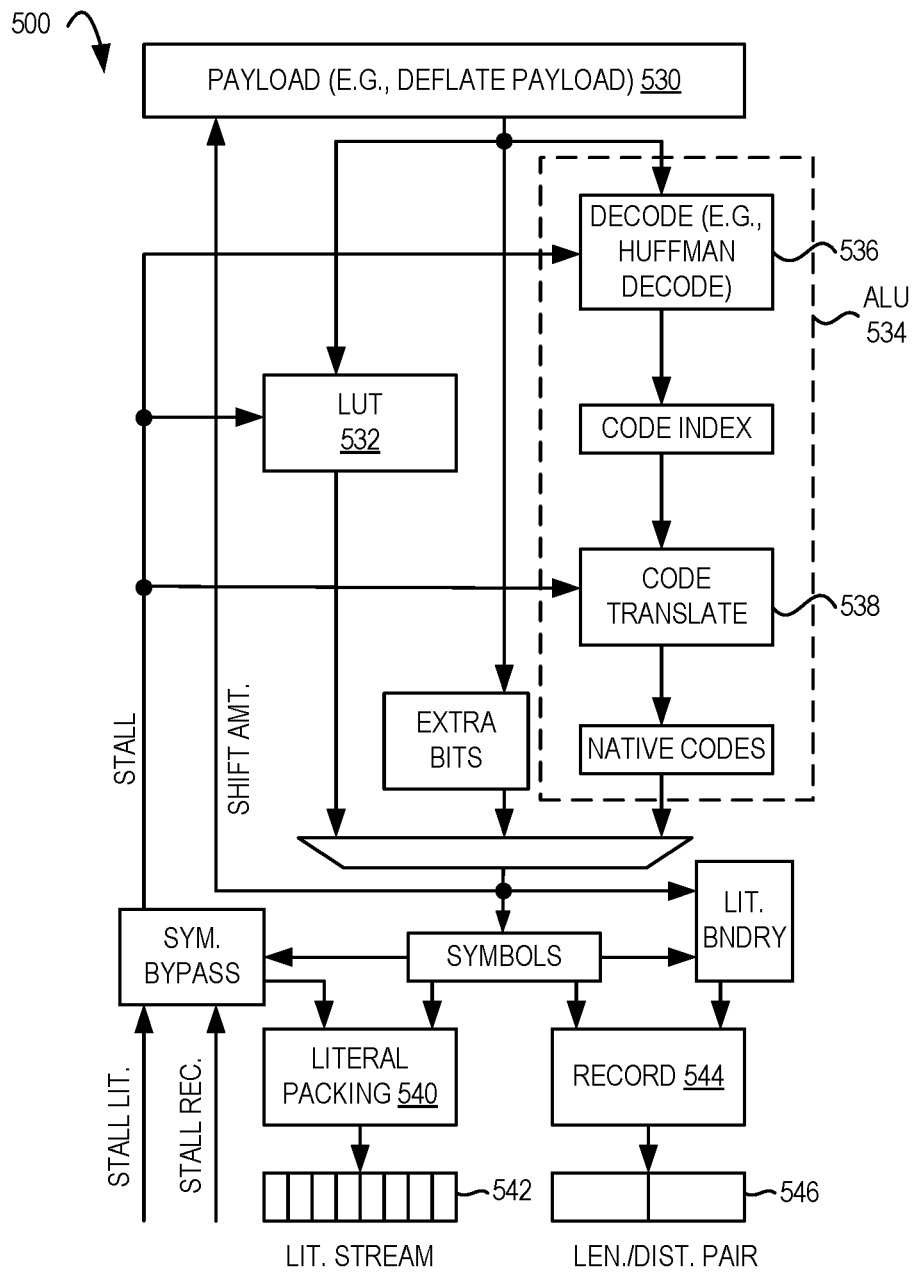
FIG. 5 illustrates a hardware decompression accelerator with a dual path decoder circuit according to embodiments of the disclosure.

FIG. 5 illustrates a hardware decompression accelerator 500 with a dual path decoder circuit according to embodiments of the disclosure. Depicted dual path decoder circuit includes a first (e.g., slow-path) circuit (e.g., with an ALU 534) and the second (e.g., fast-path) circuit (e.g., with a look-up table 532) to selectively decode payload 530. In one embodiment, the second (e.g., fast-path) circuit (e.g., with a look-up table 532) has a single (e.g., clock) cycle latency (e.g., a single cycle between an input being provided and generating an output). In one embodiment, the first (e.g., slow-path) circuit (e.g., with an ALU 534) has a greater cycle latency that the second (e.g., fast-path) circuit (e.g., with a look-up table 532). In one embodiment, the first (e.g., slow-path) circuit (e.g., with an ALU 534) has a latency of 3 or more clock cycles, e.g., from 3 to 17 clock cycles. In the depicted embodiment, e.g., maximize operating frequency, the first (e.g., slow-path) circuit (e.g., with an ALU 534) is internally pipelined twice by partitioning the circuit into the decode portion 536 (e.g., Huffman decode portion) and code translation portion 538. In one embodiment, the decode portion 536 of the circuit is to compute the raw variable length Huffman code index from the payload, and then the code translation portion 538 of the circuit is to generates the actual literal value, base, and number of extra bits from the raw index, e.g., according to the DEFLATE algorithm. For example, the extra bits may be concurrently picked from the payload and concatenated with the base to generate the biased lengths and offsets for length and distance codes, respectively. In the subsequent clock cycle, the biased lengths and offsets may be incremented by 3 and 1, respectively, to generate the actual lengths and offsets. This embodiment may simplify the underlying hardware by making it possible to generate the unbiased lengths/offsets with simple shift operations without any arithmetic (e.g., ALU) circuit operations. For example, certain addition operations may be simplified because of one operand being fixed constants (e.g., 3 and 1), but critical path latency may be further reduced by postponing these operations, for example, to a non-timing-critical third cycle (e.g., which originally only included the simple extra-bit concatenation operation).

Depicted hardware decompression accelerator 500 includes a literal packing circuit 540 and a record circuit 544. In one embodiment, literal symbols output from the first (e.g., slow-path) circuit (e.g., with an ALU 534) and the second (e.g., fast-path) circuit (e.g., with a look-up table 532) are directed (e.g., by their format) to the literal packing circuit 540. In one embodiment, the literal packing circuit 540 is to pack literal symbols into a vector (e.g., vector register 542), for example, which each element of the vector being a literal symbol. In one embodiment, this literal stream is sent (for example, to a processor or processor core) when it has reached a certain level of fullness (e.g., totally full). In one embodiment, length symbols and distance symbols output from the first (e.g., slow-path) circuit (e.g., with an ALU 534) and the second (e.g., fast-path) circuit (e.g., with a look-up table 532) are directed (e.g., by their format) to the record circuit 544. In one embodiment, record circuit 544 may receive (e.g., sequentially) a length symbol and distance symbol pair (e.g., individually and combine them into a correct pair). In one embodiment, the length and distance symbol pairs are loaded into a vector (e.g., vector register 546). In one embodiment, one or more pairs of length and distance symbols may be transmitted to the processor or processor core.

Symbol in and/or output from hardware decompression accelerator 500 may be the (e.g., final) symbol or an intermediate value (e.g., intermediate symbol), for example, according to a format in FIGS. 9-11. In one embodiment, an intermediate value (e.g., intermediate symbol) is converted to a symbol by a circuit, for example, the circuit in FIG. 7 or FIG. 8.

Figure 6:
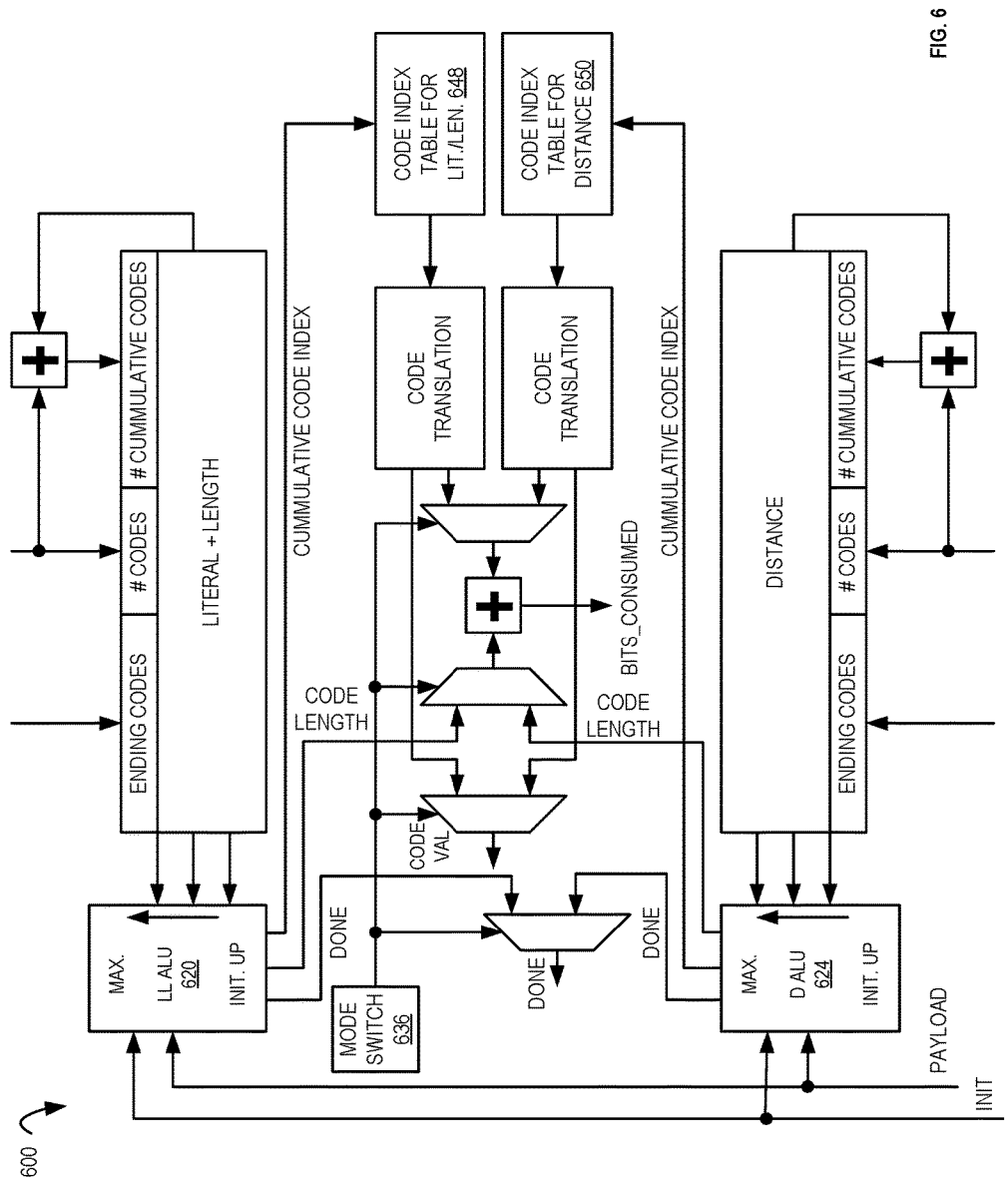
FIG. 6 illustrates a circuit to serially decode a code into a symbol according to embodiments of the disclosure.

FIG. 6 illustrates a (e.g., ALU) circuit 600 to serially decode a code into a symbol according to embodiments of the disclosure. Circuit 600 may be utilized as the first (e.g., slow-path) circuit of the embodiments discussed herein. In one embodiment, a serially decoding circuit (e.g., to decode a Huffman encoded code to a symbol), for example, an ALU, fetches the ending code and the number of codes for each code length from a (e.g., 15 entry) local LUT and computes the cumulative code index. The cumulative code index may be compared against the payload to determine if the payload matches a valid Huffman code. The cumulative code index computation step in certain embodiments makes this approach serial and limits the first (e.g., slow-path) circuit performance. In the depicted embodiment in FIG. 6, cumulative indices for (e.g., all) code lengths are pre-computed (e.g., while parsing the block header) and stored in this first (e.g., slow-path) circuit LUTs (e.g., Literal and Length Code Index Table 648 and Distance Code Index Table 650). In certain embodiments, this allows payload evaluation against any arbitrary code-length, for example, to provide improvement in decode throughput and/or may also expose the first circuit (e.g., slow path) decode process to parallelization by eliminating the serial step. For example, throughput may be improved in certain embodiments by instantiating multiple slow path decoders. In one embodiment, mode switch 636 of circuit 600 is to switch between a first mode for a literal or length type of code and a second mode for a distance type of code), for example, on detection of that type of code. In one embodiment, an ALU (e.g., ALU circuit) includes an (e.g., up) counter to progressively evaluate bit lengths of codes, for example, from an initial (e.g., given) value (e.g., 10 bits) to the maximum value (e.g., 15 bits). In one embodiment, an ALU (e.g., Distance D ALU 620 or Literal and Length LL ALU 624) only evaluates code lengths greater than a given (e.g., pre-selected) bit length (e.g., code length), for example, where those code lengths less than or equal to the given bit length are decoded in LUT having entries therefor. In one embodiment, the given length is different for each of a D ALU and an LL ALU. In another embodiment, an ALU (e.g., ALU circuit) includes a statemachine (e.g., replacing the counter) to direct the circuit to evaluate code lengths (e.g., in a non-contiguous order, such as, but not limited to, 14,12,10,13,15). Circuit 600 may output a symbol, e.g., and not an intermediate value (e.g., intermediate symbol).

FIG. 7 illustrates a circuit 700 to determine from a table a literal symbol for a literal code and a length symbol for a length code according to embodiments of the disclosure. FIG. 8 illustrates a circuit 800 to determine from a table a distance symbol for a distance code according to embodiments of the disclosure. FIG. 9 illustrates entry formats for a table 900 of mappings of a literal symbol for a literal code and a length symbol for a length code according to embodiments of the disclosure. FIG. 10 illustrates an entry format for a table 1000 of mappings of a distance symbol for a distance code according to embodiments of the disclosure. FIG. 11 illustrates entry (e.g., intermediate) formats for a table of an end of block (EOB) indication 1108 and for mappings of a literal symbol for a literal code 1102, a length symbol for a length code 1104, a length symbol for a 255 bit length code 1106, a distance symbol for a distance code 1110 according to embodiments of the disclosure.

In certain embodiments, a LUT (e.g., LUT 900 for lengths and literals and LUT 1000 for distance) may include one or more entries mapping a (e.g., Huffman encoded) code to a symbol. In one embodiment, the code maps to a linear address of the corresponding entry in the table for that code. In one embodiment, entries in a table are populated before use of the table, for example, populated from the data in a header of an encoded, compressed data stream (e.g., a DEFLATE data stream). In one embodiment, the entries in LUT 900 for lengths and literals are each 14 bits in length for example, according to the formats in FIG. 11. In one embodiment, the entries in the LUT 1000 for distance are each 12 bits in length, for example, according to the distance format 1110 in FIG. 11. These are example formats and other numbers of bits may be utilized in other embodiments.

In reference to FIGS. 9 and 11, entries for a mapping of a code to a symbol include one or more of: literal values for literal symbols stored in the 8 bit format of $\{L_7,L_6,L_5,L_4,L_3,L_2,L_1,L_0\}$, and base and extra-bits for length/distance symbols stored in the three bit format of $\{B_2,B_1,B_0\}$ and $\{E_2,E_1,E_0\}$ respectively. In certain embodiments, additionally or alternatively, entries for a mapping of a code to a symbol may include (e.g., pre-computed) shift magnitudes $\{S_4,S_3,S_2,S_1,S_0\}$ for each entry, for example, in contrast to a format that stores the code lengths for each entry.

EOB may have format 1108, e.g., such that the seven most significant bits, indicated that it is an EOB and not one of the other types (e.g., formats) of data.

Referring again to FIGS. 7 and 8, a second (e.g., fast-path) circuit (e.g., with look-up tables 900 and 1000) may receive a code to decode into a symbol. The second (e.g., fast-path) circuit may determine the type of code, for example, to send a decode request for a length or literal code to a Length and Literal LUT (e.g., LUT 900) and to send a decode request for a distance code to Distance LUT (e.g., LUT 1000). Respective LUT may then provide an output symbol (e.g., in an intermediate format "C" (e.g., intermediate symbol "C")) according to the formats in FIG. 11) to the circuit 700 and/or circuit 800, which circuit(s) then may output the (e.g., final) symbol therefrom.

In one embodiment, intermediate format of data for an input code, e.g., intermediate format for a literal code (e.g., in format 1102), intermediate format for a length code (e.g., in format 1104 or 1106), intermediate format for an EOB code (e.g., in format 1108) is input into circuit 700 and the respective bits cause an output of one or more of: bit shift magnitude (shift), the symbol value (symbol_val) for the code, and the code type (code_type), e.g., a length, 255 length, literal, or EOB.

In one embodiment, intermediate format of data for an input code, e.g., intermediate format for a distance code (e.g., in format 1110) is input into circuit 700 and the respective bits cause an output of one or more of: base, extra bits, and bit shift magnitude (shift).

In one embodiment, a mode switch (e.g., mode switch 436 in FIGS. 4A and 4B) may be utilized to switch between a first mode for a literal or length type of code to output from circuit 700 and a second mode for a distance type of code), for example, on detection of that type of code to output from circuit 800. In certain embodiments, low latency is accomplished by optimally pre-computing the information in an intermediate format (e.g., not in the same format of the code or the symbol) in the LUT. In certain embodiments, a circuit (e.g., circuit 700 and circuit 800) may consume the intermediate format data for a mapping of a code to a symbol to thus output the symbol, e.g., with minimal subsequent processing. In certain embodiments, the intermediate format for an encoded code and its decoded symbol for literal/length and distance entries allows minimal post-processing following the LUT read access, e.g., to maximize the second (e.g., fast-path) circuit operating frequency. For example, as shown in FIGS. 7 and 8, the "shift", "symbol_val" and "extra_bits" fields may be generated from the LUT entry after a maximum of two logic gates. In one embodiment, other signals, e.g., like "code_type", do not impact the second (e.g., fast-path) circuit critical path, and hence may be derived from logic with deeper depth without impacting the second (e.g., fast-path) circuit critical path.

Figure 13:
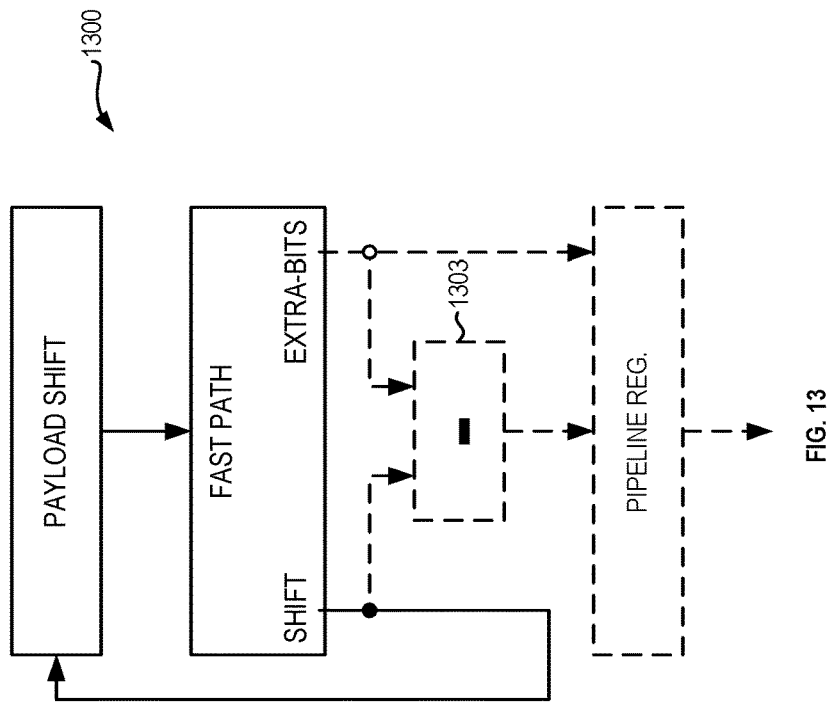
FIG. 13 illustrates a circuit to obtain the next code from a bit shift magnitude field in a table entry according to embodiments of the disclosure.
Figure 12:
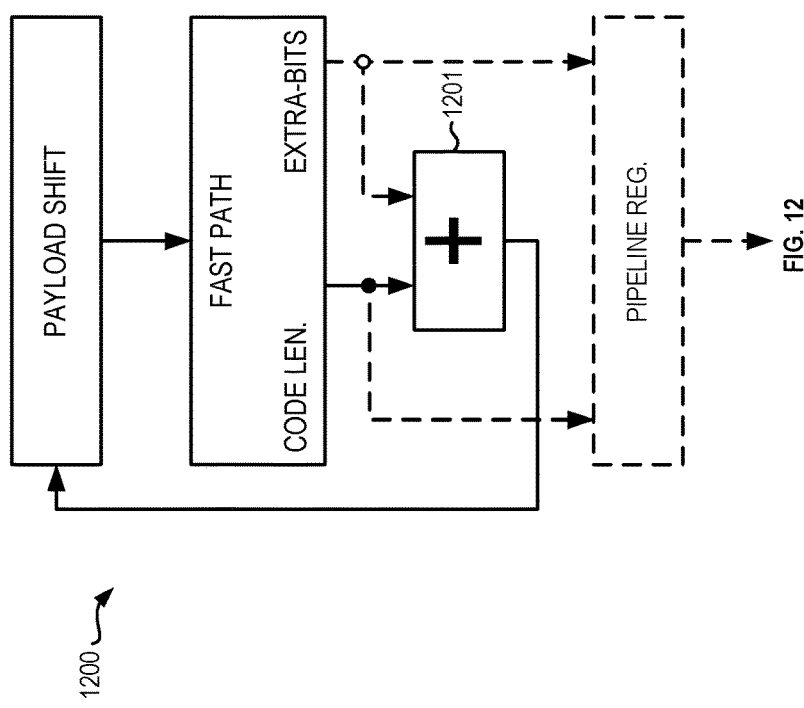
FIG. 12 illustrates a circuit to obtain the next code from a code length according to embodiments of the disclosure.

FIG. 12 illustrates a circuit 1200 to obtain the next code from a code length according to embodiments of the disclosure. FIG. 13 illustrates a circuit 1300 to obtain the next code from a bit shift magnitude field in a table entry according to embodiments of the disclosure. In the depicted embodiment in FIG. 12, the bit shift magnitude for obtaining the next code is determined by using adder 1201 to add the code length value and the extra bits value. In contrast, in the depicted embodiment in FIG. 13, the bit shift magnitude for obtaining the next code is determined by using the bit shift magnitude (e.g., without performing an addition or other calculations) from the table entry (e.g., that was previously determined during the population of the table). In one embodiment, the subtractor 1303 may be included to determine the code length by subtracting the extra bits value from the bit shift magnitude.

Figure 14:
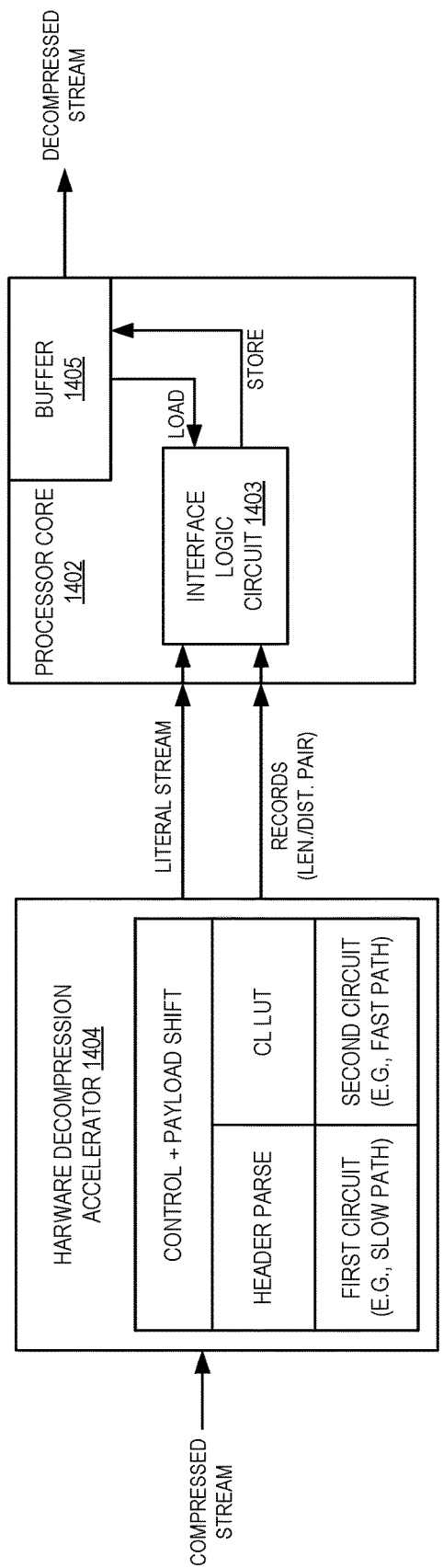
FIG. 14 illustrates a hardware processor core and a hardware decompression accelerator according to embodiments of the disclosure.

FIG. 14 illustrates a hardware processor core 1402 and a hardware decompression accelerator 1404 according to embodiments of the disclosure. In certain embodiments, the hardware decompression accelerator 1404 takes an input compressed stream and generates intermediate instructions in the form of literal (e.g., literal symbol) streams and length and distance pair records that are input into the hardware processor core 1402, e.g., through interface circuit 1403. In one embodiment, the interface circuit translates the literal streams and records into load and store instructions that operate on the buffer 1405 (e.g., that includes previously decompressed portions of the data), and thus subsequently reconstruct the decompressed stream. In certain embodiments, a buffer may be sized according to the compression algorithm being decompressed. In one embodiment, hardware decompression accelerator 1404 includes one or more of the components of hardware decompression accelerator 500 in FIG. 5).

Figure 15:
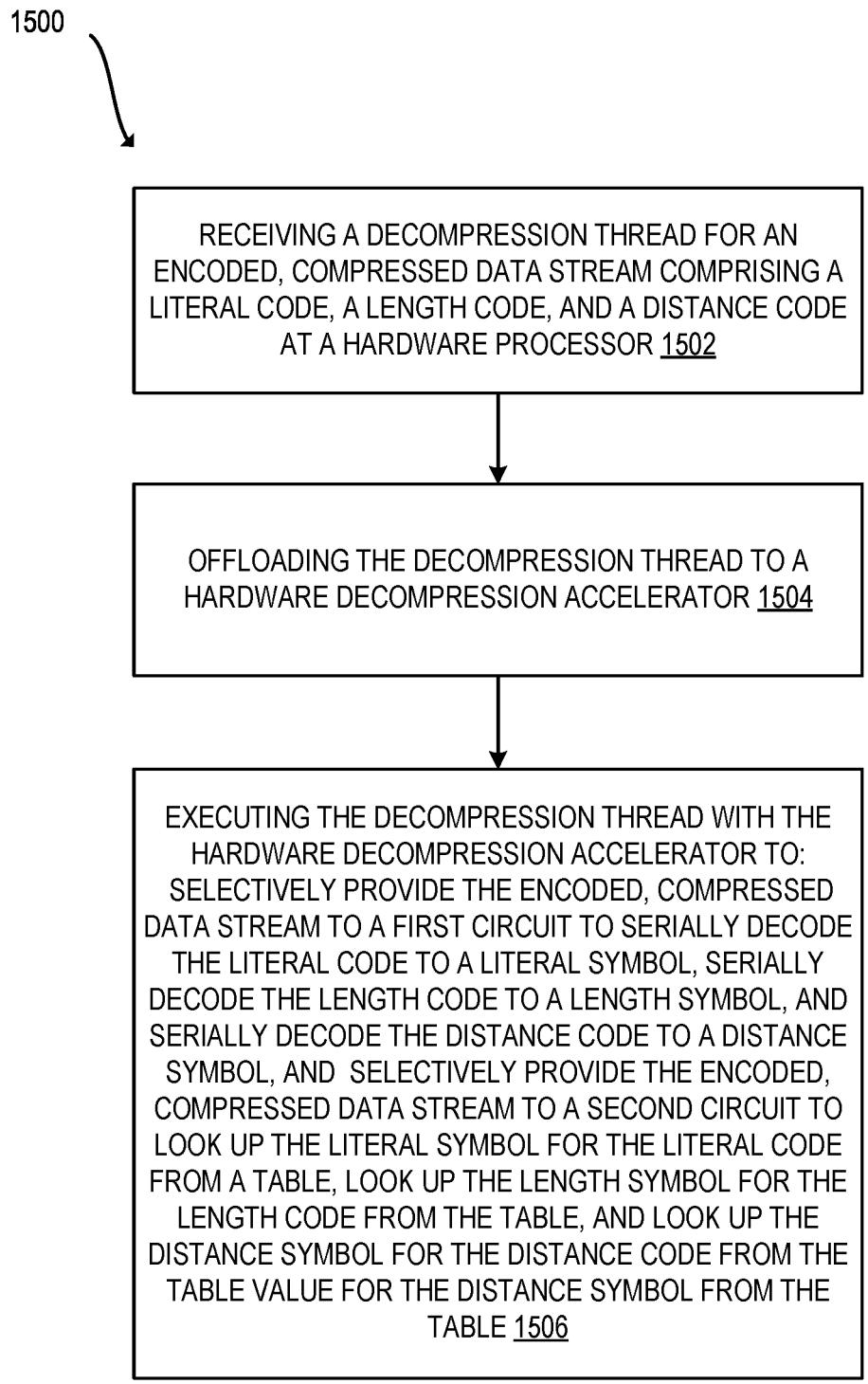
FIG. 15 illustrates a flow diagram according to embodiments of the disclosure.

FIG. 15 illustrates a flow diagram 1500 according to embodiments of the disclosure. Flow diagram 1500 includes receiving a decompression thread for an encoded, compressed data stream comprising a literal code, a length code, and a distance code at a hardware processor 1502, offloading the decompression thread to a hardware decompression accelerator 1504, and executing the decompression thread with the hardware decompression accelerator to: selectively provide the encoded, compressed data stream to a first circuit to serially decode the literal code to a literal symbol, serially decode the length code to a length symbol, and serially decode the distance code to a distance symbol, and selectively provide the encoded, compressed data stream to a second circuit to look up the literal symbol for the literal code from a table, look up the length symbol for the length code from the table, and look up the distance symbol for the distance code from the table, wherein each mapping of a code to a symbol entry in the table further comprises a bit shift magnitude field for the code to obtain a next code of the encoded, compressed data stream 1506.

Certain embodiments herein may be utilized in a client decompressing (e.g., hypertext transfer protocol (HTTP)) traffic from a server. Certain embodiments herein may be utilized in database, storage and networking applications to speed up decompression, for example, in web-traffic, index-servers, I/O assistance in compressed file systems, and in-memory databases. Certain embodiments herein allow a hardware accelerator (e.g., execution unit) to configure the hardware towards more calculations (e.g., slow-path) or more memory look-ups (e.g., fast-path). Certain embodiments herein provides hardware and methods to increase decompression throughput, for example, through a (e.g., fast-path) data format with pre-computed shift magnitude and/or arbitrary code length evaluation scheme (e.g., in the slow-path).

In one embodiment, a hardware processor includes a core to execute a thread and offload a decompression thread for an encoded, compressed data stream comprising a literal code, a length code, and a distance code, and a hardware decompression accelerator to execute the decompression thread to: selectively provide the encoded, compressed data stream to a first circuit to serially decode the literal code to a literal symbol, serially decode the length code to a length symbol, and serially decode the distance code to a distance symbol, and selectively provide the encoded, compressed data stream to a second circuit to look up the literal symbol (e.g., via an intermediate value) for the literal code from a table, look up the length symbol (e.g., via an intermediate value) for the length code from the table, and look up the distance symbol (e.g., via an intermediate value) for the distance code from the table, wherein each mapping of a code to a symbol entry in the table further comprises a bit shift magnitude field for the code to obtain a next code of the encoded, compressed data stream. Each code of the literal code, the length code, and the distance code may have a (e.g., same or different) maximum bit length and the table may only include a mapping of symbols to codes for codes with a bit length less than the maximum bit length. The hardware decompression accelerator may execute the decompression thread to: concurrently provide one of the literal code, the length code, and the distance code to the first circuit and the second circuit, and output a corresponding symbol of the literal symbol, the length symbol, and the distance symbol for the one of the literal code, the length code, and the distance code from a first of the first circuit and the second circuit that determines the corresponding symbol. The hardware decompression accelerator may execute the decompression thread to: provide one of the literal code, the length code, and the distance code to the second circuit, and when a corresponding symbol of the literal symbol, the length symbol, and the distance symbol for the one of the literal code, the length code, and the distance code is not in the table, provide the one of the literal code, the length code, and the distance code to the first circuit to determine the corresponding symbol. Each entry in the table for: a literal code may include a literal field, the bit shift magnitude field, and a length or literal indication field, a length code may include a base field, an extra bit field, the bit shift magnitude field, and a length or literal indication field, and a distance code may include a base field, an extra bit field, and the bit shift magnitude field. The hardware decompression accelerator may execute the decompression thread to: execute the decompression thread to cause a mode switch for the first circuit and the second circuit to be set to a first mode for the distance code and a second mode for either of the length code and the literal code. The hardware processor may include a circuit to receive an output of the first circuit and the second circuit and to store a literal symbol as an element in a first vector and send the first vector from the hardware decompression accelerator to the core when the first vector is full, and to store a distance symbol and length symbol pair as at least one element in a second vector and send the second vector from the hardware decompression accelerator to the core when the second vector is full. The literal code, the length code, and the distance code may be Huffman encoded codes. The hardware decompression accelerator may execute the decompression thread to: selectively provide the encoded, compressed data stream to a third circuit to serially decode the literal code to a literal symbol, serially decode the length code to a length symbol, and serially decode the distance code to a distance symbol, wherein the third circuit is to serially decode codes with a bit length of a first set of bit lengths and the first circuit is to serially decode codes with a bit length of a second, different set of bit lengths.

In another embodiment, a method includes receiving a decompression thread for an encoded, compressed data stream comprising a literal code, a length code, and a distance code at a hardware processor, offloading the decompression thread to a hardware decompression accelerator, and executing the decompression thread with the hardware decompression accelerator to: selectively provide the encoded, compressed data stream to a first circuit to serially decode the literal code to a literal symbol, serially decode the length code to a length symbol, and serially decode the distance code to a distance symbol, and selectively provide the encoded, compressed data stream to a second circuit to look up the literal symbol for the literal code from a table, look up the length symbol for the length code from the table, and look up the distance symbol for the distance code from the table, wherein each mapping of a code to a symbol entry in the table further comprises a bit shift magnitude field for the code to obtain a next code of the encoded, compressed data stream. Each code of the literal code, the length code, and the distance code may have a maximum bit length and the table may only include a mapping of symbols to codes for codes with a bit length less than the maximum bit length. The method may include executing the decompression thread to: concurrently provide one of the literal code, the length code, and the distance code to the first circuit and the second circuit, and output a corresponding symbol of the literal symbol, the length symbol, and the distance symbol for the one of the literal code, the length code, and the distance code from a first of the first circuit and the second circuit that determines the corresponding symbol. The method may include executing the decompression thread to: provide one of the literal code, the length code, and the distance code to the second circuit, and when a corresponding symbol of the literal symbol, the length symbol, and the distance symbol for the one of the literal code, the length code, and the distance code is not in the table, provide the one of the literal code, the length code, and the distance code to the first circuit to determine the corresponding symbol. The method may include populating each entry in the table for: a literal code with a literal field, the bit shift magnitude field, and a length or literal indication field, a length code with a base field, an extra bit field, the bit shift magnitude field, and a length or literal indication field, and a distance code with a base field, an extra bit field, and the bit shift magnitude field. The method may include executing the decompression thread to cause a mode switch for the first circuit and the second circuit to be set to a first mode for the distance code and a second mode for either of the length code and the literal code. The method may include storing a literal symbol from either of the first circuit and the second circuit as an element in a first vector and sending the first vector from the hardware decompression accelerator to the hardware processor when the first vector is full, and storing a distance symbol and length symbol pair from either of the first circuit and the second circuit as at least one element in a second vector and sending the second vector from the hardware decompression accelerator to the hardware processor when the second vector is full. The literal code, the length code, and the distance code may be Huffman encoded codes. The method may include executing the decompression thread to: selectively provide the encoded, compressed data stream to a third circuit to serially decode the literal code to a literal symbol, serially decode the length code to a length symbol, and serially decode the distance code to a distance symbol, wherein the third circuit is to serially decode codes with a bit length of a first set of bit lengths and the first circuit is to serially decode codes with a bit length of a second, different set of bit lengths.

In yet another embodiment, a system includes a hardware processor to execute a thread and offload a decompression thread for an encoded, compressed data stream comprising a literal code, a length code, and a distance code, and a hardware decompression accelerator to execute the decompression thread to: selectively provide the encoded, compressed data stream to a first circuit to serially decode the literal code to a literal symbol, serially decode the length code to a length symbol, and serially decode the distance code to a distance symbol, and selectively provide the encoded, compressed data stream to a second circuit to look up the literal symbol for the literal code from a table, look up the length symbol for the length code from the table, and look up the distance symbol for the distance code from the table, wherein each mapping of a code to a symbol entry in the table further comprises a bit shift magnitude field for the code to obtain a next code of the encoded, compressed data stream. Each code of the literal code, the length code, and the distance code may have a maximum bit length and the table may only include a mapping of symbols to codes for codes with a bit length less than the maximum bit length. The hardware decompression accelerator may execute the decompression thread to: concurrently provide one of the literal code, the length code, and the distance code to the first circuit and the second circuit, and output a corresponding symbol of the literal symbol, the length symbol, and the distance symbol for the one of the literal code, the length code, and the distance code from a first of the first circuit and the second circuit that determines the corresponding symbol. The hardware decompression accelerator may execute the decompression thread to: provide one of the literal code, the length code, and the distance code to the second circuit, and when a corresponding symbol of the literal symbol, the length symbol, and the distance symbol for the one of the literal code, the length code, and the distance code is not in the table, provide the one of the literal code, the length code, and the distance code to the first circuit to determine the corresponding symbol. Each entry in the table for: a literal code may include a literal field, the bit shift magnitude field, and a length or literal indication field, a length code may include a base field, an extra bit field, the bit shift magnitude field, and a length or literal indication field, and a distance code may include a base field, an extra bit field, and the bit shift magnitude field. The hardware decompression accelerator may execute the decompression thread to: cause a mode switch for the first circuit and the second circuit to be set to a first mode for the distance code and a second mode for either of the length code and the literal code. The system may include a circuit to receive an output of the first circuit and the second circuit and to store a literal symbol as an element in a first vector and send the first vector from the hardware decompression accelerator to the hardware processor when the first vector is full, and to store a distance symbol and length symbol pair as at least one element in a second vector and send the second vector from the hardware decompression accelerator to the hardware processor when the second vector is full. The literal code, the length code, and the distance code may be Huffman encoded codes. The hardware decompression accelerator may execute the decompression thread to: selectively provide the encoded, compressed data stream to a third circuit to serially decode the literal code to a literal symbol, serially decode the length code to a length symbol, and serially decode the distance code to a distance symbol, wherein the third circuit is to serially decode codes with a bit length of a first set of bit lengths and the first circuit is to serially decode codes with a bit length of a second, different set of bit lengths.

In another embodiment, a hardware processor includes means to execute a thread and offload a decompression thread for an encoded, compressed data stream comprising a literal code, a length code, and a distance code, and means to execute the decompression thread to: selectively provide the encoded, compressed data stream to a first circuit to serially decode the literal code to a literal symbol, serially decode the length code to a length symbol, and serially decode the distance code to a distance symbol, and selectively provide the encoded, compressed data stream to a second circuit to look up the literal symbol for the literal code from a table, look up the length symbol for the length code from the table, and look up the distance symbol for the distance code from the table, wherein each mapping of a code to a symbol entry in the table further comprises a bit shift magnitude field for the code to obtain a next code of the encoded, compressed data stream.

In yet another embodiment, an apparatus comprises a data storage device that stores code that when executed by a hardware processor causes the hardware processor to perform any method disclosed herein. An apparatus may be as described in the detailed description. A method may be as described in the detailed description.

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, September 2015; and see Intel® Architecture Instruction Set Extensions Programming Reference, August 2015).

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-order and Out-of-order Core Block Diagram

FIG. 16A is a block diagram illustrating both an exemplary in-order pipeline and an exemplary register renaming, out-of-order issue/execution pipeline according to embodiments of the disclosure. FIG. 16B is a block diagram illustrating both an exemplary embodiment of an in-order architecture core and an exemplary register renaming, out-of-order issue/execution architecture core to be included in a processor according to embodiments of the disclosure. The solid lined boxes in FIGS. 16A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 16A, a processor pipeline 1600 includes a fetch stage 1602, a length decode stage 1604, a decode stage 1606, an allocation stage 1608, a renaming stage 1610, a scheduling (also known as a dispatch or issue) stage 1612, a register read/memory read stage 1614, an execute stage 1616, a write back/memory write stage 1618, an exception handling stage 1622, and a commit stage 1624.

FIG. 16B shows processor core 1690 including a front end unit 1630 coupled to an execution engine unit 1650, and both are coupled to a memory unit 1670. The core 1690 may be a reduced instruction set computing (RISC) core, a complex instruction set computing (CISC) core, a very long instruction word (VLIW) core, or a hybrid or alternative core type. As yet another option, the core 1690 may be a special-purpose core, such as, for example, a network or communication core, compression engine, coprocessor core, general purpose computing graphics processing unit (GPGPU) core, graphics core, or the like.

The front end unit 1630 includes a branch prediction unit 1632 coupled to an instruction cache unit 1634, which is coupled to an instruction translation lookaside buffer (TLB) 1636, which is coupled to an instruction fetch unit 1638, which is coupled to a decode unit 1640. The decode unit 1640 (or decoder or decoder unit) may decode instructions (e.g., macro-instructions), and generate as an output one or more micro-operations, micro-code entry points, micro-instructions, other instructions, or other control signals, which are decoded from, or which otherwise reflect, or are derived from, the original instructions. The decode unit 1640 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1690 includes a microcode ROM or other medium that stores microcode for certain macroinstructions (e.g., in decode unit 1640 or otherwise within the front end unit 1630). The decode unit 1640 is coupled to a rename/allocator unit 1652 in the execution engine unit 1650.

The execution engine unit 1650 includes the rename/allocator unit 1652 coupled to a retirement unit 1654 and a set of one or more scheduler unit(s) 1656. The scheduler unit(s) 1656 represents any number of different schedulers, including reservations stations, central instruction window, etc. The scheduler unit(s) 1656 is coupled to the physical register file(s) unit(s) 1658. Each of the physical register file(s) units 1658 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1658 comprises a vector registers unit, a write mask registers unit, and a scalar registers unit. These register units may provide architectural vector registers, vector mask registers, and general purpose registers. The physical register file(s) unit(s) 1658 is overlapped by the retirement unit 1654 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1654 and the physical register file(s) unit(s) 1658 are coupled to the execution cluster(s) 1660. The execution cluster(s) 1660 includes a set of one or more execution units 1662 and a set of one or more memory access units 1664. The execution units 1662 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1656, physical register file(s) unit(s) 1658, and execution cluster(s) 1660 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1664). It should also be understood that where separate pipelines are used, one or more of these pipelines may be out-of-order issue/execution and the rest in-order.

The set of memory access units 1664 is coupled to the memory unit 1670, which includes a data TLB unit 1672 coupled to a data cache unit 1674 coupled to a level 2 (L2) cache unit 1676. In one exemplary embodiment, the memory access units 1664 may include a load unit, a store address unit, and a store data unit, each of which is coupled to the data TLB unit 1672 in the memory unit 1670. The instruction cache unit 1634 is further coupled to a level 2 (L2) cache unit 1676 in the memory unit 1670. The L2 cache unit 1676 is coupled to one or more other levels of cache and eventually to a main memory.

By way of example, the exemplary register renaming, out-of-order issue/execution core architecture may implement the pipeline 1600 as follows: 1) the instruction fetch 1638 performs the fetch and length decoding stages 1602 and 1604; 2) the decode unit 1640 performs the decode stage 1606; 3) the rename/allocator unit 1652 performs the allocation stage 1608 and renaming stage 1610; 4) the scheduler unit(s) 1656 performs the schedule stage 1612; 5) the physical register file(s) unit(s) 1658 and the memory unit 1670 perform the register read/memory read stage 1614; the execution cluster 1660 perform the execute stage 1616; 6) the memory unit 1670 and the physical register file(s) unit(s) 1658 perform the write back/memory write stage 1618; 7) various units may be involved in the exception handling stage 1622; and 8) the retirement unit 1654 and the physical register file(s) unit(s) 1658 perform the commit stage 1624.

The core 1690 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1690 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1634/1674 and a shared L2 cache unit 1676, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-order Core Architecture

Figure 17B:
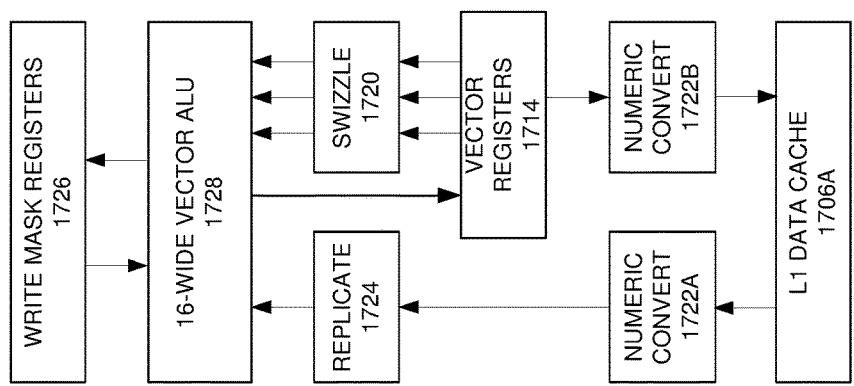
FIG. 17B is an expanded view of part of the processor core in FIG. 17A according to embodiments of the disclosure.
Figure 17A:
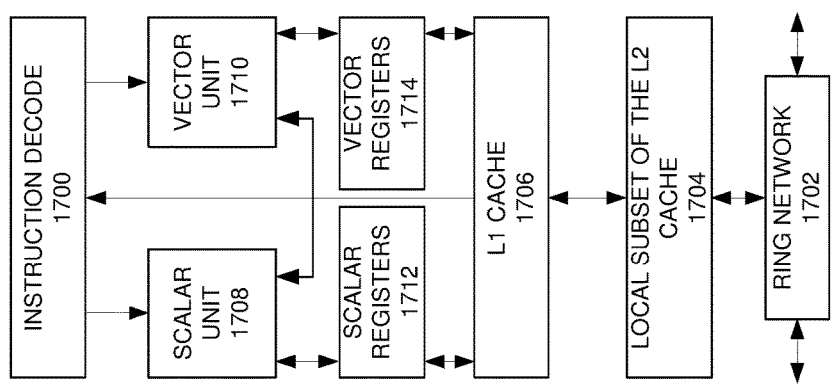
FIG. 17A is a block diagram of a single processor core, along with its connection to the on-die interconnect network and with its local subset of the Level 2 (L2) cache, according to embodiments of the disclosure.

FIGS. 17A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 17A is a block diagram of a single processor core, along with its connection to the on-die interconnect network 1702 and with its local subset of the Level 2 (L2) cache 1704, according to embodiments of the disclosure. In one embodiment, an instruction decode unit 1700 supports the x86 instruction set with a packed data instruction set extension. An L1 cache 1706 allows low-latency accesses to cache memory into the scalar and vector units. While in one embodiment (to simplify the design), a scalar unit 1708 and a vector unit 1710 use separate register sets (respectively, scalar registers 1712 and vector registers 1714) and data transferred between them is written to memory and then read back in from a level 1 (L1) cache 1706, alternative embodiments of the disclosure may use a different approach (e.g., use a single register set or include a communication path that allow data to be transferred between the two register files without being written and read back).

The local subset of the L2 cache 1704 is part of a global L2 cache that is divided into separate local subsets, one per processor core. Each processor core has a direct access path to its own local subset of the L2 cache 1704. Data read by a processor core is stored in its L2 cache subset 1704 and can be accessed quickly, in parallel with other processor cores accessing their own local L2 cache subsets. Data written by a processor core is stored in its own L2 cache subset 1704 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 17B is an expanded view of part of the processor core in FIG. 17A according to embodiments of the disclosure. FIG. 17B includes an L1 data cache 1706A part of the L1 cache 1704, as well as more detail regarding the vector unit 1710 and the vector registers 1714. Specifically, the vector unit 1710 is a 16-wide vector processing unit (VPU) (see the 16-wide ALU 1728), which executes one or more of integer, single-precision float, and double-precision float instructions. The VPU supports swizzling the register inputs with swizzle unit 1720, numeric conversion with numeric convert units 1722A-B, and replication with replication unit 1724 on the memory input. Write mask registers 1726 allow predicating resulting vector writes.

Figure 18:
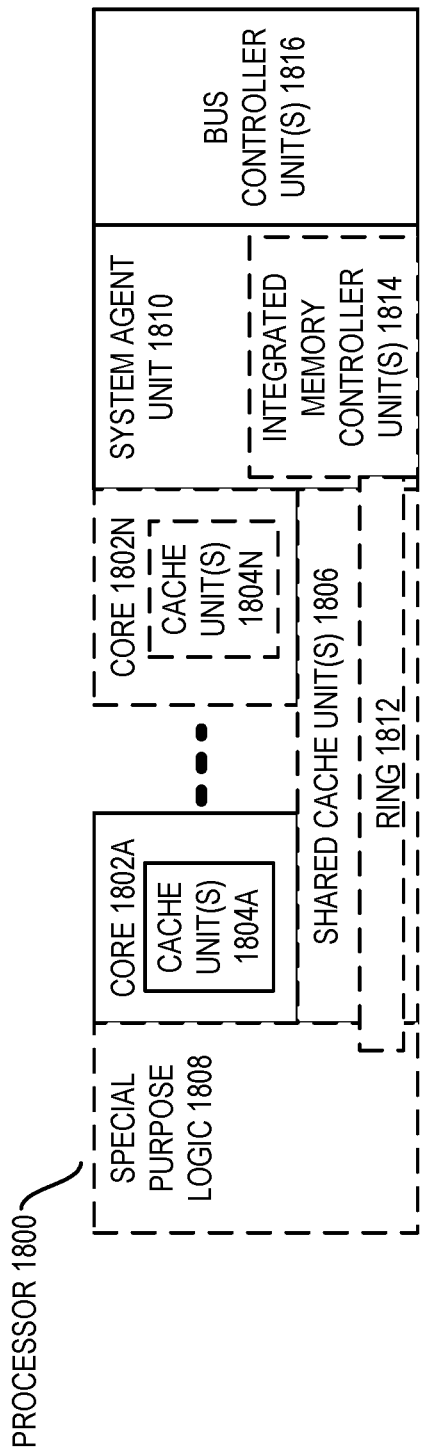
FIG. 18 is a block diagram of a processor that may have more than one core, may have an integrated memory controller, and may have integrated graphics according to embodiments of the disclosure.

FIG. 18 is a block diagram of a processor 1800 that may have more than one core, may have an integrated memory controller, and may have integrated graphics according to embodiments of the disclosure. The solid lined boxes in FIG. 18 illustrate a processor 1800 with a single core 1802A, a system agent 1810, a set of one or more bus controller units 1816, while the optional addition of the dashed lined boxes illustrates an alternative processor 1800 with multiple cores 1802A-N, a set of one or more integrated memory controller unit(s) 1814 in the system agent unit 1810, and special purpose logic 1808.

Thus, different implementations of the processor 1800 may include: 1) a CPU with the special purpose logic 1808 being integrated graphics and/or scientific (throughput) logic (which may include one or more cores), and the cores 1802A-N being one or more general purpose cores (e.g., general purpose in-order cores, general purpose out-of-order cores, a combination of the two); 2) a coprocessor with the cores 1802A-N being a large number of special purpose cores intended primarily for graphics and/or scientific (throughput); and 3) a coprocessor with the cores 1802A-N being a large number of general purpose in-order cores. Thus, the processor 1800 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1800 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1806, and external memory (not shown) coupled to the set of integrated memory controller units 1814. The set of shared cache units 1806 may include one or more mid-level caches, such as level 2 (L2), level 3 (L3), level 4 (L4), or other levels of cache, a last level cache (LLC), and/or combinations thereof. While in one embodiment a ring based interconnect unit 1812 interconnects the integrated graphics logic 1808, the set of shared cache units 1806, and the system agent unit 1810/integrated memory controller unit(s) 1814, alternative embodiments may use any number of well-known techniques for interconnecting such units. In one embodiment, coherency is maintained between one or more cache units 1806 and cores 1802-A-N.

In some embodiments, one or more of the cores 1802A-N are capable of multi-threading. The system agent 1810 includes those components coordinating and operating cores 1802A-N. The system agent unit 1810 may include for example a power control unit (PCU) and a display unit. The PCU may be or include logic and components needed for regulating the power state of the cores 1802A-N and the integrated graphics logic 1808. The display unit is for driving one or more externally connected displays.

The cores 1802A-N may be homogenous or heterogeneous in terms of architecture instruction set; that is, two or more of the cores 1802A-N may be capable of execution the same instruction set, while others may be capable of executing only a subset of that instruction set or a different instruction set.

Exemplary Computer Architectures

FIGS. 19-22 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 19:
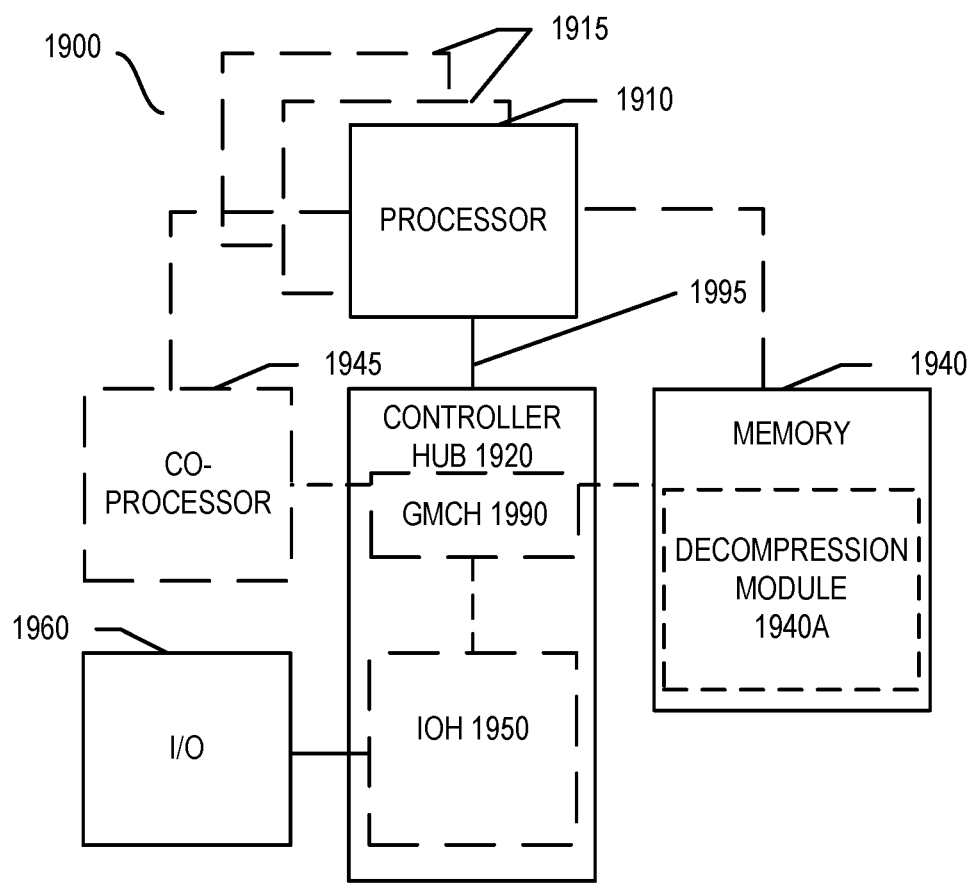
FIG. 19 is a block diagram of a system in accordance with one embodiment of the present disclosure.

Referring now to FIG. 19, shown is a block diagram of a system 1900 in accordance with one embodiment of the present disclosure. The system 1900 may include one or more processors 1910, 1915, which are coupled to a controller hub 1920. In one embodiment the controller hub 1920 includes a graphics memory controller hub (GMCH) 1990 and an Input/Output Hub (IOH) 1950 (which may be on separate chips); the GMCH 1990 includes memory and graphics controllers to which are coupled memory 1940 and a coprocessor 1945; the IOH 1950 is couples input/output (I/O) devices 1960 to the GMCH 1990. Alternatively, one or both of the memory and graphics controllers are integrated within the processor (as described herein), the memory 1940 and the coprocessor 1945 are coupled directly to the processor 1910, and the controller hub 1920 in a single chip with the IOH 1950. Memory 1940 may include a decompression module 1940A, for example, to store code that when executed causes a processor to perform any method of this disclosure.

The optional nature of additional processors 1915 is denoted in FIG. 19 with broken lines. Each processor 1910,

1915 may include one or more of the processing cores described herein and may be some version of the processor 1800.

The memory 1940 may be, for example, dynamic random access memory (DRAM), phase change memory (PCM), or a combination of the two. For at least one embodiment, the controller hub 1920 communicates with the processor(s) 1910, 1915 via a multi-drop bus, such as a frontside bus (FSB), point-to-point interface such as QuickPath Interconnect (QPI), or similar connection 1995.

In one embodiment, the coprocessor 1945 is a special-purpose processor, such as, for example, a high-throughput MIC processor, a network or communication processor, compression engine, graphics processor, GPGPU, embedded processor, or the like. In one embodiment, controller hub 1920 may include an integrated graphics accelerator.

There can be a variety of differences between the physical resources 1910, 1915 in terms of a spectrum of metrics of merit including architectural, microarchitectural, thermal, power consumption characteristics, and the like.

In one embodiment, the processor 1910 executes instructions that control data processing operations of a general type. Embedded within the instructions may be coprocessor instructions. The processor 1910 recognizes these coprocessor instructions as being of a type that should be executed by the attached coprocessor 1945. Accordingly, the processor 1910 issues these coprocessor instructions (or control signals representing coprocessor instructions) on a coprocessor bus or other interconnect, to coprocessor 1945. Coprocessor(s) 1945 accept and execute the received coprocessor instructions.

Figure 20:
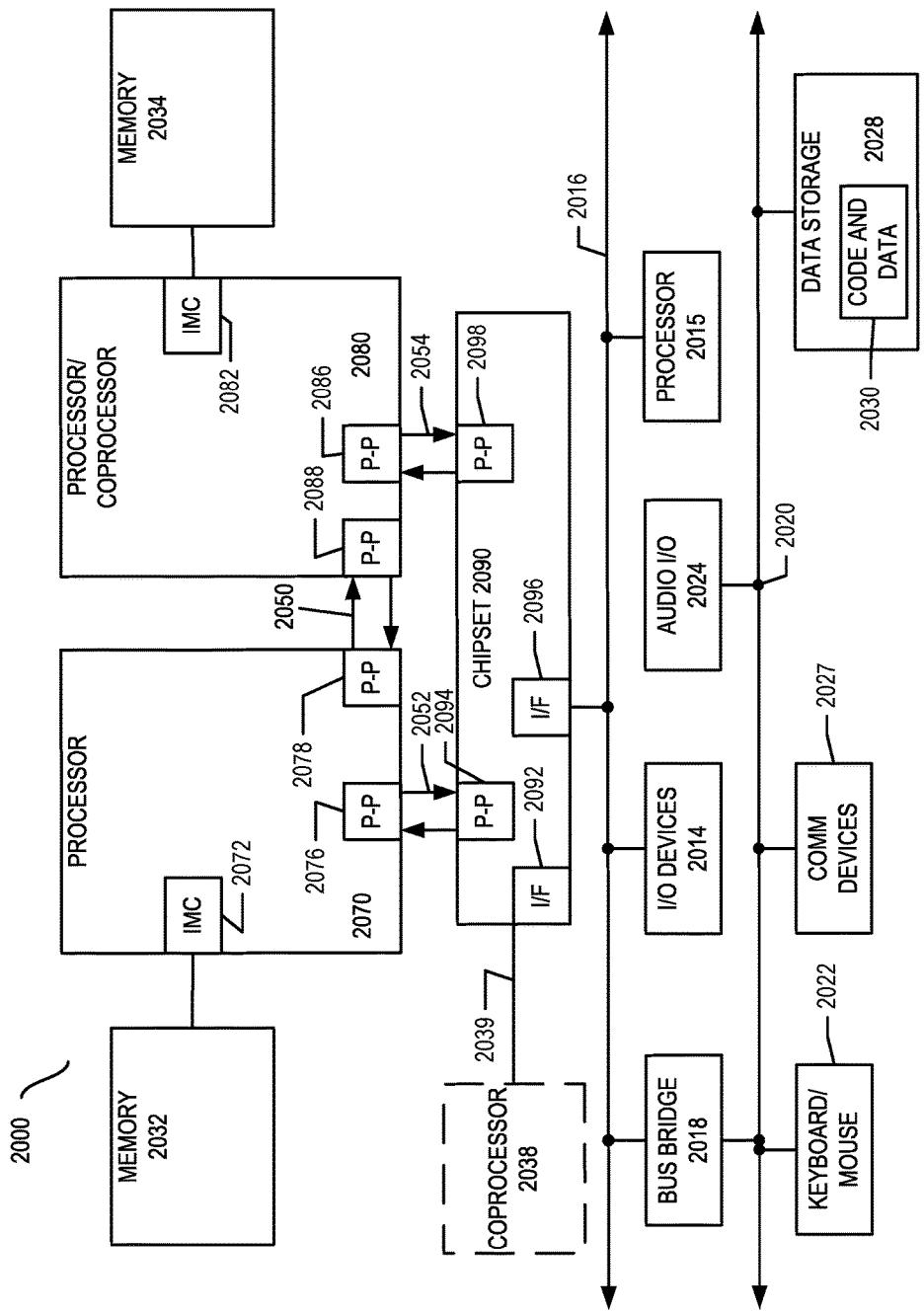
FIG. 20 is a block diagram of a more specific exemplary system in accordance with an embodiment of the present disclosure.

Referring now to FIG. 20, shown is a block diagram of a first more specific exemplary system 2000 in accordance with an embodiment of the present disclosure. As shown in FIG. 20, multiprocessor system 2000 is a point-to-point interconnect system, and includes a first processor 2070 and a second processor 2080 coupled via a point-to-point interconnect 2050. Each of processors 2070 and 2080 may be some version of the processor 1800. In one embodiment of the disclosure, processors 2070 and 2080 are respectively processors 1910 and 1915, while coprocessor 2038 is coprocessor 1945. In another embodiment, processors 2070 and 2080 are respectively processor 1910 coprocessor 1945.

Processors 2070 and 2080 are shown including integrated memory controller (IMC) units 2072 and 2082, respectively. Processor 2070 also includes as part of its bus controller units point-to-point (P-P) interfaces 2076 and 2078; similarly, second processor 2080 includes P-P interfaces 2086 and 2088. Processors 2070, 2080 may exchange information via a point-to-point (P-P) interface 2050 using P-P interface circuits 2078, 2088. As shown in FIG. 20, IMCs 2072 and 2082 couple the processors to respective memories, namely a memory 2032 and a memory 2034, which may be portions of main memory locally attached to the respective processors.

Processors 2070, 2080 may each exchange information with a chipset 2090 via individual P-P interfaces 2052, 2054 using point to point interface circuits 2076, 2094, 2086, 2098. Chipset 2090 may optionally exchange information with the coprocessor 2038 via a high-performance interface 2039. In one embodiment, the coprocessor 2038 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 2090 may be coupled to a first bus 2016 via an interface 2096. In one embodiment, first bus 2016 may be a Peripheral Component Interconnect (PCI) bus, or a bus such as a PCI Express bus or another third generation I/O interconnect bus, although the scope of the present disclosure is not so limited.

As shown in FIG. 20, various I/O devices 2014 may be coupled to first bus 2016, along with a bus bridge 2018 which couples first bus 2016 to a second bus 2020. In one embodiment, one or more additional processor(s) 2015, such as coprocessors, high-throughput MIC processors, GPGPU's, accelerators (such as, e.g., graphics accelerators or digital signal processing (DSP) units), field programmable gate arrays, or any other processor, are coupled to first bus 2016. In one embodiment, second bus 2020 may be a low pin count (LPC) bus. Various devices may be coupled to a second bus 2020 including, for example, a keyboard and/or mouse 2022, communication devices 2027 and a storage unit 2028 such as a disk drive or other mass storage device which may include instructions/code and data 2030, in one embodiment. Further, an audio I/O 2024 may be coupled to the second bus 2020. Note that other architectures are possible. For example, instead of the point-to-point architecture of FIG. 20, a system may implement a multi-drop bus or other such architecture.

Figure 21:
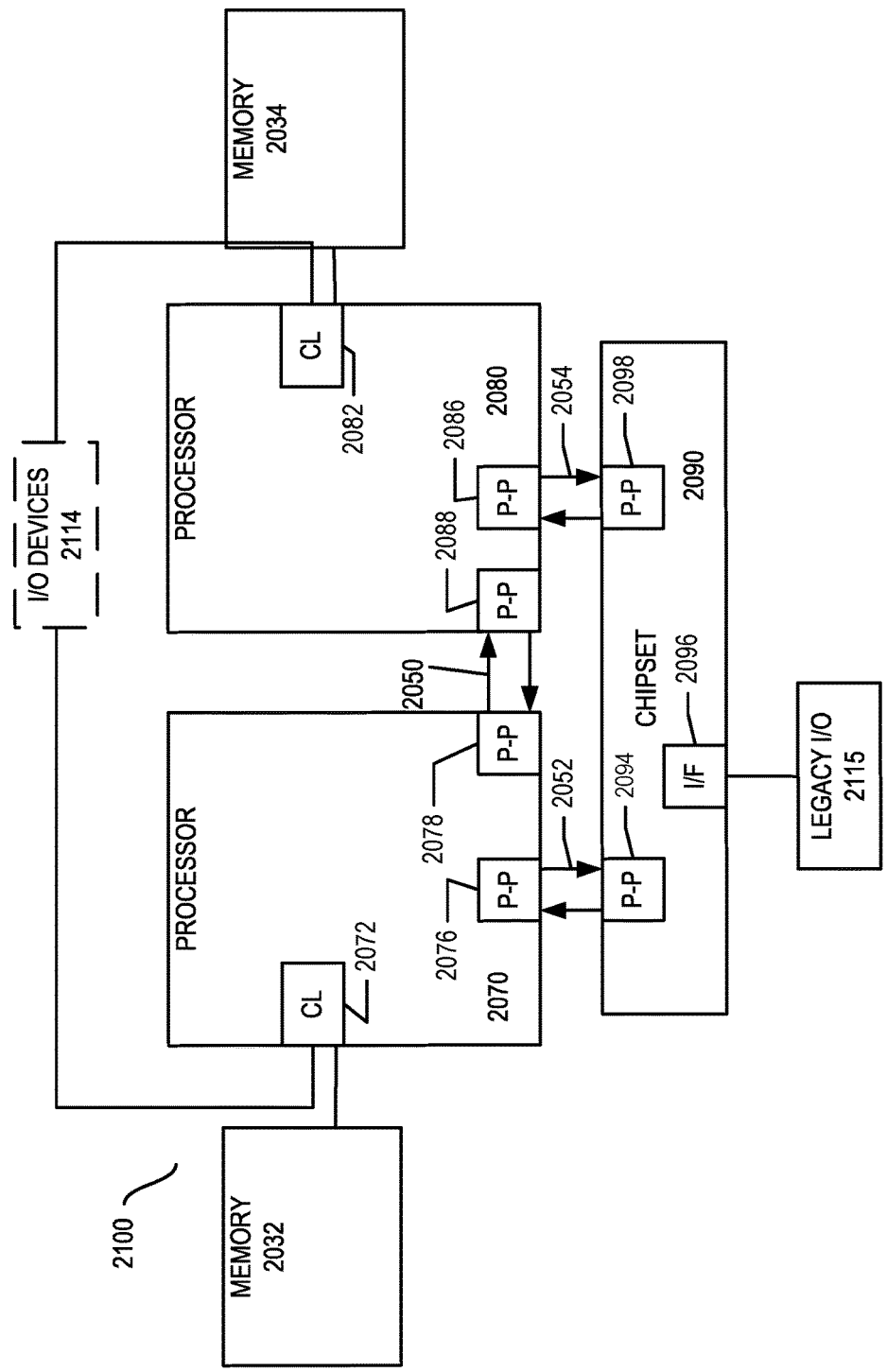
FIG. 21, shown is a block diagram of a second more specific exemplary system in accordance with an embodiment of the present disclosure.

Referring now to FIG. 21, shown is a block diagram of a second more specific exemplary system 2100 in accordance with an embodiment of the present disclosure. Like elements in FIGS. 20 and 21 bear like reference numerals, and certain aspects of FIG. 20 have been omitted from FIG. 21 in order to avoid obscuring other aspects of FIG. 21.

FIG. 21 illustrates that the processors 2070, 2080 may include integrated memory and I/O control logic ("CL") 2072 and 2082, respectively. Thus, the CL 2072, 2082 include integrated memory controller units and include I/O control logic. FIG. 21 illustrates that not only are the memories 2032, 2034 coupled to the CL 2072, 2082, but also that I/O devices 2114 are also coupled to the control logic 2072, 2082. Legacy I/O devices 2115 are coupled to the chipset 2090.

Figure 22:
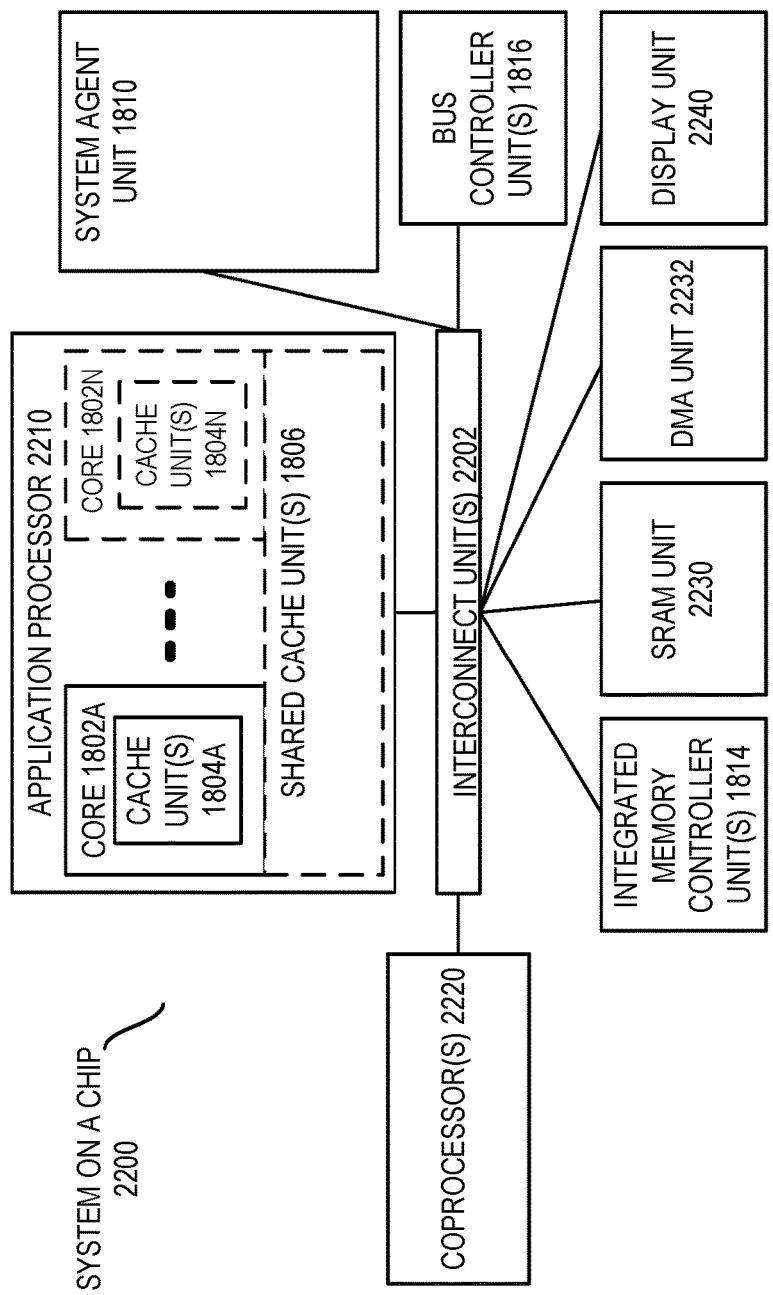
FIG. 22, shown is a block diagram of a system on a chip (SoC) in accordance with an embodiment of the present disclosure.

Referring now to FIG. 22, shown is a block diagram of a SoC 2200 in accordance with an embodiment of the present disclosure. Similar elements in FIG. 18 bear like reference numerals. Also, dashed lined boxes are optional features on more advanced SoCs. In FIG. 22, an interconnect unit(s) 2202 is coupled to: an application processor 2210 which includes a set of one or more cores 202A-N and shared cache unit(s) 1806; a system agent unit 1810; a bus controller unit(s) 1816; an integrated memory controller unit(s) 1814; a set or one or more coprocessors 2220 which may include integrated graphics logic, an image processor, an audio processor, and a video processor; an static random access memory (SRAM) unit 2230; a direct memory access (DMA) unit 2232; and a display unit 2240 for coupling to one or more external displays. In one embodiment, the coprocessor(s) 2220 include a special-purpose processor, such as, for example, a network or communication processor, compression engine, GPGPU, a high-throughput MIC processor, embedded processor, or the like.

Embodiments (e.g., of the mechanisms) disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 2030 illustrated in FIG. 20, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the disclosure also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 23 is a block diagram contrasting the use of a software instruction converter to convert binary instructions in a source instruction set to binary instructions in a target instruction set according to embodiments of the disclosure. In the illustrated embodiment, the instruction converter is a software instruction converter, although alternatively the instruction converter may be implemented in software, firmware, hardware, or various combinations thereof. FIG. 23 shows a program in a high level language 2302 may be compiled using an x86 compiler 2304 to generate x86 binary code 2306 that may be natively executed by a processor with at least one x86 instruction set core 2316. The processor with at least one x86 instruction set core 2316 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 2304 represents a compiler that is operable to generate x86 binary code 2306 (e.g., object code) that can, with or without additional linkage processing, be executed on the processor with at least one x86 instruction set core 2316. Similarly, FIG. 23 shows the program in the high level language 2302 may be compiled using an alternative instruction set compiler 2308 to generate alternative instruction set binary code 2310 that may be natively executed by a processor without at least one x86 instruction set core 2314 (e.g., a processor with cores that execute the MIPS instruction set of MIPS Technologies of Sunnyvale, Calif. and/or that execute the ARM instruction set of ARM Holdings of Sunnyvale, Calif.). The instruction converter 2312 is used to convert the x86 binary code 2306 into code that may be natively executed by the processor without an x86 instruction set core 2314. This converted code is not likely to be the same as the alternative instruction set binary code 2310 because an instruction converter capable of this is difficult to make; however, the converted code will accomplish the general operation and be made up of instructions from the alternative instruction set. Thus, the instruction converter 2312 represents software, firmware, hardware, or a combination thereof that, through emulation, simulation or any other process, allows a processor or other electronic device that does not have an x86 instruction set processor or core to execute the x86 binary code 2306.

What is claimed is:

1. A hardware processor comprising:
   a core to execute a thread and offload a decompression thread for an encoded, compressed data stream comprising a literal code, a length code, and a distance code; and
   a hardware decompression accelerator to execute the decompression thread to:
      selectively provide the encoded, compressed data stream to a first circuit to serially decode the literal code to a literal symbol, serially decode the length code to a length symbol, and serially decode the distance code to a distance symbol, and
      selectively provide the encoded, compressed data stream to a second circuit to look up the literal symbol for the literal code from a table, look up the length symbol for the length code from the table, and look up the distance symbol for the distance code from the table, wherein each code of the literal code, the length code, and the distance code has a maximum bit length and the table only includes a mapping of symbols to codes for codes with a bit length less than the maximum bit length.

2. The hardware processor of claim 1, wherein each mapping of a code to a symbol entry in the table further comprises a bit shift magnitude field for the code to obtain a next code of the encoded, compressed data stream.

3. The hardware processor of claim 1, wherein the hardware decompression accelerator is to execute the decompression thread to:
concurrently provide one of the literal code, the length code, and the distance code to the first circuit and the second circuit, and
output a corresponding symbol of the literal symbol, the length symbol, and the distance symbol for the one of the literal code, the length code, and the distance code from a first of the first circuit and the second circuit that determines the corresponding symbol.

4. The hardware processor of claim 1, wherein the hardware decompression accelerator is to execute the decompression thread to:
provide one of the literal code, the length code, and the distance code to the second circuit, and
when a corresponding symbol of the literal symbol, the length symbol, and the distance symbol for the one of the literal code, the length code, and the distance code is not in the table, provide the one of the literal code, the length code, and the distance code to the first circuit to determine the corresponding symbol.

5. The hardware processor of claim 1, wherein each entry in the table for:
a literal code comprises a literal field, a bit shift magnitude field, and a length or literal indication field,
a length code comprises a base field, an extra bit field, a bit shift magnitude field, and a length or literal indication field, and
a distance code comprises a base field, an extra bit field, and a bit shift magnitude field.

6. The hardware processor of claim 1, wherein the hardware decompression accelerator is to execute the decompression thread to cause a mode switch for the first circuit and the second circuit to be set to a first mode for the distance code and a second mode for either of the length code and the literal code.

7. The hardware processor of claim 1, further comprising a circuit to receive an output of the first circuit and the second circuit and to store a literal symbol as an element in a first vector and send the first vector from the hardware decompression accelerator to the core when the first vector is full, and to store a distance symbol and length symbol pair as at least one element in a second vector and send the second vector from the hardware decompression accelerator to the core when the second vector is full.

8. The hardware processor of claim 1, wherein the hardware decompression accelerator is to execute the decompression thread to:
selectively provide the encoded, compressed data stream to a third circuit to serially decode the literal code to a literal symbol, serially decode the length code to a length symbol, and serially decode the distance code to a distance symbol, wherein the third circuit is to serially decode codes with a bit length of a first set of bit lengths and the first circuit is to serially decode codes with a bit length of a second, different set of bit lengths.

9. A method comprising:
receiving a decompression thread for an encoded, compressed data stream comprising a literal code, a length code, and a distance code at a hardware processor;
offloading the decompression thread to a hardware decompression accelerator; and
executing the decompression thread with the hardware decompression accelerator to:
selectively provide the encoded, compressed data stream to a first circuit to serially decode the literal code to a literal symbol, serially decode the length code to a length symbol, and serially decode the distance code to a distance symbol, and
selectively provide the encoded, compressed data stream to a second circuit to look up the literal symbol for the literal code from a table, look up the length symbol for the length code from the table, and look up the distance symbol for the distance code from the table, wherein each code of the literal code, the length code, and the distance code has a maximum bit length and the table only includes a mapping of symbols to codes for codes with a bit length less than the maximum bit length.

10. The method of claim 9, wherein each mapping of a code to a symbol entry in the table further comprises a bit shift magnitude field for the code to obtain a next code of the encoded, compressed data stream.

11. The method of claim 9, further comprising executing the decompression thread to:
concurrently provide one of the literal code, the length code, and the distance code to the first circuit and the second circuit, and
output a corresponding symbol of the literal symbol, the length symbol, and the distance symbol for the one of the literal code, the length code, and the distance code from a first of the first circuit and the second circuit that determines the corresponding symbol.

12. The method of claim 9, further comprising executing the decompression thread to:
provide one of the literal code, the length code, and the distance code to the second circuit, and
when a corresponding symbol of the literal symbol, the length symbol, and the distance symbol for the one of the literal code, the length code, and the distance code is not in the table, provide the one of the literal code, the length code, and the distance code to the first circuit to determine the corresponding symbol.

13. The method of claim 9, further comprising populating each entry in the table for:
a literal code with a literal field, a bit shift magnitude field, and a length or literal indication field,
a length code with a base field, an extra bit field, a bit shift magnitude field, and a length or literal indication field, and
a distance code with a base field, an extra bit field, and a bit shift magnitude field.

14. The method of claim 9, further comprising executing the decompression thread to cause a mode switch for the first circuit and the second circuit to be set to a first mode for the distance code and a second mode for either of the length code and the literal code.

15. The method of claim 9, further comprising:
storing a literal symbol from either of the first circuit and the second circuit as an element in a first vector and sending the first vector from the hardware decompression accelerator to the hardware processor when the first vector is full, and storing a distance symbol and length symbol pair from either of the first circuit and the second circuit as at least one element in a second vector and sending the second vector from the hardware decompression accelerator to the hardware processor when the second vector is full.

16. The method of claim 9, further comprising executing the decompression thread to:
selectively provide the encoded, compressed data stream to a third circuit to serially decode the literal code to a literal symbol, serially decode the length code to a length symbol, and serially decode the distance code to a distance symbol, wherein the third circuit is to serially decode codes with a bit length of a first set of bit lengths and the first circuit is to serially decode codes with a bit length of a second, different set of bit lengths.

17. A system comprising:
a hardware processor to execute a thread and offload a decompression thread for an encoded, compressed data stream comprising a literal code, a length code, and a distance code; and
a hardware decompression accelerator to execute the decompression thread to:
selectively provide the encoded, compressed data stream to a first circuit to serially decode the literal code to a literal symbol, serially decode the length code to a length symbol, and serially decode the distance code to a distance symbol, and
selectively provide the encoded, compressed data stream to a second circuit to look up the literal symbol for the literal code from a table, look up the length symbol for the length code from the table, and look up the distance symbol for the distance code from the table, wherein each code of the literal code, the length code, and the distance code has a maximum bit length and the table only includes a mapping of symbols to codes for codes with a bit length less than the maximum bit length.

18. The system of claim 17, wherein each mapping of a code to a symbol entry in the table further comprises a bit shift magnitude field for the code to obtain a next code of the encoded, compressed data stream.

19. The system of claim 17, wherein the hardware decompression accelerator is to execute the decompression thread to:
concurrently provide one of the literal code, the length code, and the distance code to the first circuit and the second circuit, and
output a corresponding symbol of the literal symbol, the length symbol, and the distance symbol for the one of the literal code, the length code, and the distance code from a first of the first circuit and the second circuit that determines the corresponding symbol.

20. The system of claim 17, wherein the hardware decompression accelerator is to execute the decompression thread to:
provide one of the literal code, the length code, and the distance code to the second circuit, and
when a corresponding symbol of the literal symbol, the length symbol, and the distance symbol for the one of the literal code, the length code, and the distance code is not in the table, provide the one of the literal code, the length code, and the distance code to the first circuit to determine the corresponding symbol.

21. The system of claim 17, wherein each entry in the table for:
a literal code comprises a literal field, a bit shift magnitude field, and a length or literal indication field,
a length code comprises a base field, an extra bit field, a bit shift magnitude field, and a length or literal indication field, and
a distance code comprises a base field, an extra bit field, and a bit shift magnitude field.

22. The system of claim 17, wherein the hardware decompression accelerator is to execute the decompression thread to cause a mode switch for the first circuit and the second circuit to be set to a first mode for the distance code and a second mode for either of the length code and the literal code.

23. The system of claim 17, further comprising a circuit to receive an output of the first circuit and the second circuit and to store a literal symbol as an element in a first vector and send the first vector from the hardware decompression accelerator to the hardware processor when the first vector is full, and to store a distance symbol and length symbol pair as at least one element in a second vector and send the second vector from the hardware decompression accelerator to the hardware processor when the second vector is full.

24. The system of claim 17, wherein the hardware decompression accelerator is to execute the decompression thread to:
selectively provide the encoded, compressed data stream to a third circuit to serially decode the literal code to a literal symbol, serially decode the length code to a length symbol, and serially decode the distance code to a distance symbol, wherein the third circuit is to serially decode codes with a bit length of a first set of bit lengths and the first circuit is to serially decode codes with a bit length of a second, different set of bit lengths.

* * * * *